US012449593B2

(12) United States Patent
Coolbaugh et al.

(10) Patent No.: US 12,449,593 B2
(45) Date of Patent: Oct. 21, 2025

(54) FABRICATING PHOTONICS STRUCTURE CONDUCTIVE PATHWAYS

(71) Applicant: The Research Foundation for the State University of New York, Albany, NY (US)

(72) Inventors: Douglas Coolbaugh, Albany, NY (US); Gerald Leake, Albany, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 317 days.

(21) Appl. No.: 17/596,775

(22) PCT Filed: Apr. 16, 2020

(86) PCT No.: PCT/US2020/028418
§ 371 (c)(1),
(2) Date: Dec. 17, 2021

(87) PCT Pub. No.: WO2020/256819
PCT Pub. Date: Dec. 24, 2020

(65) Prior Publication Data
US 2022/0229228 A1     Jul. 21, 2022

Related U.S. Application Data

(60) Provisional application No. 62/862,825, filed on Jun. 18, 2019.

(30) Foreign Application Priority Data

Apr. 14, 2020   (TW) ................................ 109112443

(51) Int. Cl.
G02B 6/12       (2006.01)
G02B 6/136      (2006.01)

(52) U.S. Cl.
CPC ......... *G02B 6/12004* (2013.01); *G02B 6/136* (2013.01)

(58) Field of Classification Search
CPC ........... H01L 31/0232; H01L 31/02325; H01L 31/02327; H01L 21/76802–76817; G02B 6/136; G02B 6/12004
See application file for complete search history.

(56) References Cited

U.S. PATENT DOCUMENTS

| 5,841,931 A | 11/1998 | Foresi et al. |
| 6,108,464 A | 8/2000 | Foresi et al. |

(Continued)

FOREIGN PATENT DOCUMENTS

| WO |     0010202 A1 | 2/2000 |
| WO | WO2009113961 A1 | 9/2009 |

(Continued)

OTHER PUBLICATIONS

Written Opinion and International Search Report in International Application No. PCT/US2020/028418, 17 pages. Nov. 18, 2020.

(Continued)

*Primary Examiner* — Sung H Pak
(74) *Attorney, Agent, or Firm* — Heslin Rothenberg Farley & Mesiti P.C.; George S. Blasiak, Esq.

(57) ABSTRACT

There is set forth herein a method including fabricating a photonics structure having one or more photonics device. The method can include forming one or more conductive material formation for communicating electrical signals to and/or from the one or more photonics device.

20 Claims, 18 Drawing Sheets

(56) References Cited

U.S. PATENT DOCUMENTS

| | | |
|---|---|---|
| 6,621,972 B2 | 9/2003 | Kimerling et al. |
| 6,631,225 B2 | 10/2003 | Lee et al. |
| 6,635,110 B1 | 10/2003 | Luan et al. |
| 6,690,871 B2 | 2/2004 | Lee et al. |
| 6,697,551 B2 | 2/2004 | Lee et al. |
| 6,812,495 B2 | 11/2004 | Wada et al. |
| 6,850,683 B2 | 2/2005 | Lee et al. |
| 6,879,014 B2 | 4/2005 | Wagner et al. |
| 6,884,636 B2 | 4/2005 | Fiorini et al. |
| 6,887,773 B2 | 5/2005 | Gunn, III et al. |
| 6,927,392 B2 | 8/2005 | Liddiard |
| 6,946,318 B2 | 9/2005 | Wada et al. |
| 7,008,813 B1 | 3/2006 | Lee et al. |
| 7,043,120 B2 | 5/2006 | Wada et al. |
| 7,075,081 B2 | 7/2006 | Fiorini et al. |
| 7,095,010 B2 | 8/2006 | Scherer et al. |
| 7,103,245 B2 | 9/2006 | Lee et al. |
| 7,123,805 B2 | 10/2006 | Sparacin et al. |
| 7,186,611 B2 | 3/2007 | Hsu et al. |
| 7,190,871 B2 | 3/2007 | Lock et al. |
| 7,194,166 B1 | 3/2007 | Gunn, III et al. |
| 7,251,386 B1 | 7/2007 | Dickinson et al. |
| 7,259,031 B1 | 8/2007 | Dickinson et al. |
| 7,262,117 B1 | 8/2007 | Gunn, III et al. |
| 7,266,263 B2 | 9/2007 | Ahn et al. |
| 7,279,682 B2 | 10/2007 | Ouvrier-Buffet et al. |
| 7,305,157 B2 | 12/2007 | Ahn et al. |
| 7,317,242 B2 | 1/2008 | Takizawa |
| 7,320,896 B2 | 1/2008 | Fiorini et al. |
| 7,321,713 B2 | 1/2008 | Akiyama et al. |
| 7,340,709 B1 | 3/2008 | Masini et al. |
| 7,358,527 B1 | 4/2008 | Masini et al. |
| 7,389,029 B2 | 6/2008 | Rahman et al. |
| 7,397,101 B1 | 7/2008 | Masini et al. |
| 7,424,181 B2 | 9/2008 | Haus et al. |
| 7,453,129 B2 | 11/2008 | King et al. |
| 7,453,132 B1 | 11/2008 | Gunn, III et al. |
| 7,459,686 B2 | 12/2008 | Syllaios et al. |
| 7,480,430 B2 | 1/2009 | Saini et al. |
| 7,508,050 B1 | 3/2009 | Pei et al. |
| 7,565,046 B2 | 7/2009 | Feng et al. |
| 7,613,369 B2 | 11/2009 | Witzens et al. |
| 7,616,904 B1 | 11/2009 | Gunn, III et al. |
| 7,651,880 B2 | 1/2010 | Tweet et al. |
| 7,659,627 B2 | 2/2010 | Miyachi et al. |
| 7,700,975 B2 | 4/2010 | Rakshit et al. |
| 7,723,206 B2 | 5/2010 | Miyachi et al. |
| 7,723,754 B2 | 5/2010 | Wada et al. |
| 7,736,734 B2 | 6/2010 | Carothers et al. |
| 7,737,534 B2 | 6/2010 | McLaughlin et al. |
| 7,754,540 B2 | 7/2010 | Vashchenko et al. |
| 7,767,499 B2 | 8/2010 | Herner |
| 7,773,836 B2 | 8/2010 | De Dobbelaere |
| 7,790,495 B2 | 9/2010 | Assefa et al. |
| 7,801,406 B2 | 9/2010 | Pan et al. |
| 7,812,404 B2 | 10/2010 | Herner et al. |
| 7,816,767 B2 | 10/2010 | Pei et al. |
| 7,831,123 B2 | 11/2010 | Sparacin et al. |
| 7,902,620 B2 | 3/2011 | Assefa et al. |
| 7,906,825 B2 | 3/2011 | Tweet et al. |
| 7,916,377 B2 | 3/2011 | Witzens et al. |
| 7,943,471 B1 | 5/2011 | Bauer et al. |
| 7,961,992 B2 | 6/2011 | De Dobbelaere et al. |
| 7,973,377 B2 | 7/2011 | King et al. |
| 7,994,066 B1 | 8/2011 | Capellini et al. |
| 7,999,344 B2 | 8/2011 | Assefa et al. |
| 8,030,668 B2 | 10/2011 | Hisamoto et al. |
| 8,121,447 B2 | 2/2012 | De Dobbelaere et al. |
| 8,165,431 B2 | 4/2012 | De Dobbelaere et al. |
| 8,168,939 B2 | 5/2012 | Mack et al. |
| 8,178,382 B2 | 5/2012 | Assefa et al. |
| 8,188,512 B2 | 5/2012 | Kim et al. |
| 8,227,787 B2 | 7/2012 | Kumar et al. |
| 8,238,014 B2 | 8/2012 | Kucharski et al. |
| 8,289,067 B2 | 10/2012 | Kucharski et al. |
| 8,304,272 B2 | 11/2012 | Assefa et al. |
| 8,343,792 B2 | 1/2013 | Carothers et al. |
| 8,354,282 B2 | 1/2013 | Stern |
| 8,358,940 B2 | 1/2013 | Kucharski et al. |
| 8,399,949 B2 | 3/2013 | Meade |
| 8,440,989 B2 | 5/2013 | Mack et al. |
| 8,455,292 B2 | 6/2013 | Assefa et al. |
| 8,471,639 B2 | 6/2013 | Welch |
| 8,577,191 B2 | 11/2013 | De Dobbelaere et al. |
| 8,592,745 B2 | 11/2013 | Masini et al. |
| 8,604,866 B2 | 12/2013 | Kucharski et al. |
| 8,614,116 B2 | 12/2013 | Assefa et al. |
| 8,625,935 B2 | 1/2014 | Mekis et al. |
| 8,626,002 B2 | 1/2014 | Kucharski et al. |
| 8,633,067 B2 | 1/2014 | Assefa et al. |
| 8,649,639 B2 | 2/2014 | Mekis et al. |
| 8,664,739 B2 | 3/2014 | King et al. |
| 8,665,508 B2 | 3/2014 | Kucharski et al. |
| RE44,829 E | 4/2014 | De Dobbelaere et al. |
| 8,698,271 B2 | 4/2014 | Suh et al. |
| 8,742,398 B2 | 6/2014 | Klem et al. |
| 8,754,711 B2 | 6/2014 | Welch |
| 8,772,704 B2 | 7/2014 | Mack et al. |
| 8,787,774 B2 | 7/2014 | Guckenberger |
| 8,798,476 B2 | 8/2014 | Gloeckner et al. |
| RE45,214 E | 10/2014 | De Dobbelaere et al. |
| RE45,215 E | 10/2014 | De Dobbelaere et al. |
| 8,877,616 B2 | 11/2014 | Pinguet et al. |
| 8,895,413 B2 | 11/2014 | Pinguet et al. |
| 8,923,664 B2 | 12/2014 | Mekis et al. |
| RE45,390 E | 2/2015 | De Dobbelaere et al. |
| 9,046,650 B2 | 6/2015 | Lin et al. |
| 9,053,980 B2 | 6/2015 | Pinguet et al. |
| 9,091,827 B2 | 7/2015 | Verslegers et al. |
| 9,110,221 B2 | 8/2015 | Agarwal et al. |
| 9,671,557 B1 | 6/2017 | Ding |
| 9,711,662 B1 | 7/2017 | Gong et al. |
| 9,864,138 B2 * | 1/2018 | Coolbaugh ....... H01L 31/02327 |
| 9,874,693 B2 | 1/2018 | Baiocco et al. |
| 10,295,745 B2 | 5/2019 | Coolbaugh et al. |
| 10,571,631 B2 | 2/2020 | Coolbaugh et al. |
| 10,698,156 B2 | 6/2020 | Coolbaugh et al. |
| 10,816,724 B2 | 10/2020 | Coolbaugh et al. |
| 10,830,952 B2 | 11/2020 | Coolbaugh et al. |
| 10,877,300 B2 | 12/2020 | Coolbaugh et al. |
| 10,883,924 B2 | 1/2021 | O'Mullane et al. |
| 10,976,491 B2 | 4/2021 | Coolbaugh et al. |
| 11,029,466 B2 | 6/2021 | Charles et al. |
| 11,378,739 B2 | 7/2022 | Coolbaugh et al. |
| 2002/0070457 A1 * | 6/2002 | Sun ................... H01L 21/76804 |
| | | 257/E21.585 |
| 2003/0215203 A1 | 11/2003 | Lock et al. |
| 2004/0183202 A1 | 9/2004 | Usami |
| 2005/0012040 A1 | 1/2005 | Fiorini et al. |
| 2005/0051705 A1 | 3/2005 | Yasaitis |
| 2005/0101084 A1 | 5/2005 | Gilton |
| 2005/0205954 A1 | 9/2005 | King et al. |
| 2006/0110844 A1 | 5/2006 | Lee et al. |
| 2006/0194357 A1 | 8/2006 | Hsu et al. |
| 2006/0243973 A1 | 11/2006 | Gilton |
| 2006/0249753 A1 | 11/2006 | Herner |
| 2006/0250836 A1 | 11/2006 | Herner et al. |
| 2006/0250837 A1 | 11/2006 | Herner |
| 2006/0289764 A1 | 12/2006 | Fiorini et al. |
| 2007/0034978 A1 | 2/2007 | Pralle et al. |
| 2007/0099329 A1 | 5/2007 | Maa et al. |
| 2007/0104410 A1 | 5/2007 | Ahn et al. |
| 2007/0141744 A1 | 6/2007 | Lee et al. |
| 2007/0170536 A1 | 7/2007 | Hsu et al. |
| 2007/0190722 A1 | 8/2007 | Herner |
| 2007/0228414 A1 | 10/2007 | Kumar et al. |
| 2007/0246764 A1 | 10/2007 | Herner |
| 2007/0262296 A1 | 11/2007 | Bauer |
| 2008/0121805 A1 | 5/2008 | Tweet et al. |
| 2008/0157253 A1 | 7/2008 | Starikov et al. |
| 2008/0217651 A1 | 9/2008 | Liu et al. |
| 2008/0239787 A1 | 10/2008 | Herner |
| 2008/0311696 A1 | 12/2008 | Chee-Wee et al. |
| 2008/0316795 A1 | 12/2008 | Herner |

(56) References Cited

U.S. PATENT DOCUMENTS

| | | |
|---|---|---|
| 2008/0318397 A1 | 12/2008 | Herner |
| 2009/0032814 A1 | 2/2009 | Vashchenko et al. |
| 2009/0196631 A1 | 8/2009 | Daghighian et al. |
| 2010/0006961 A1 | 1/2010 | Yasaitis |
| 2010/0031992 A1 | 2/2010 | Hsu |
| 2010/0090110 A1 | 4/2010 | Tweet et al. |
| 2010/0102412 A1 | 4/2010 | Suh et al. |
| 2010/0133536 A1 | 6/2010 | Syllaios et al. |
| 2010/0133585 A1 | 6/2010 | Kim et al. |
| 2010/0151619 A1 | 6/2010 | Yasaitis |
| 2010/0213561 A1 | 8/2010 | Assefa et al. |
| 2010/0276776 A1 | 11/2010 | Lee et al. |
| 2010/0302836 A1 | 12/2010 | Herner |
| 2011/0012221 A1 | 1/2011 | Fukikata et al. |
| 2011/0027950 A1 | 2/2011 | Jones et al. |
| 2011/0156183 A1 | 6/2011 | Liu |
| 2011/0163404 A1 | 7/2011 | Lee et al. |
| 2011/0227116 A1 | 9/2011 | Saito et al. |
| 2012/0001283 A1 | 1/2012 | Assefa et al. |
| 2012/0025212 A1 | 2/2012 | Kouvetakis et al. |
| 2012/0129302 A1 | 5/2012 | Assefa et al. |
| 2012/0187280 A1 | 7/2012 | Kerness et al. |
| 2012/0193636 A1 | 8/2012 | Stern |
| 2012/0288971 A1 | 11/2012 | Boagaerts et al. |
| 2012/0288992 A1 | 11/2012 | Assefa et al. |
| 2012/0299143 A1 | 11/2012 | Stern |
| 2013/0065349 A1 | 3/2013 | Assefa et al. |
| 2013/0154042 A1 | 6/2013 | Meade |
| 2013/0202005 A1 | 8/2013 | Dutt |
| 2013/0214160 A1 | 8/2013 | Cazaux et al. |
| 2013/0228886 A1 | 9/2013 | JangJian et al. |
| 2013/0284889 A1 | 10/2013 | Giffard et al. |
| 2013/0313579 A1 | 11/2013 | Kouvetakis et al. |
| 2013/0328145 A1 | 12/2013 | Liu et al. |
| 2014/0008750 A1 | 1/2014 | Feshali et al. |
| 2014/0027826 A1* | 1/2014 | Assefa ............ H01L 31/022408 257/E27.122 |
| 2014/0029892 A1 | 1/2014 | Pomerene et al. |
| 2014/0080269 A1 | 3/2014 | Assefa et al. |
| 2014/0124669 A1 | 5/2014 | Zheng et al. |
| 2014/0131733 A1 | 5/2014 | Meade |
| 2014/0134789 A1 | 5/2014 | Assefa et al. |
| 2014/0134790 A1 | 5/2014 | Assefa et al. |
| 2014/0159129 A1 | 6/2014 | Wang et al. |
| 2014/0175510 A1 | 6/2014 | Suh et al. |
| 2014/0203325 A1 | 7/2014 | Verma et al. |
| 2014/0209985 A1 | 7/2014 | Assefa et al. |
| 2014/0264400 A1 | 9/2014 | Lipson et al. |
| 2015/0063768 A1 | 3/2015 | Budd et al. |
| 2015/0125111 A1 | 5/2015 | Orcutt et al. |
| 2016/0069792 A1 | 3/2016 | O'Mullane et al. |
| 2016/0197111 A1 | 7/2016 | Coolbaugh et al. |
| 2016/0223749 A1 | 8/2016 | Coolbaugh et al. |
| 2016/0363729 A1 | 12/2016 | Coolbaugh et al. |
| 2017/0299809 A1 | 10/2017 | Boeuf |
| 2017/0307824 A1 | 10/2017 | Usami et al. |
| 2018/0143374 A1 | 5/2018 | Coolbaugh et al. |
| 2018/0314003 A1 | 11/2018 | Coolbaugh et al. |
| 2019/0025513 A1 | 1/2019 | Coolbaugh et al. |
| 2019/0310417 A1 | 10/2019 | Coolbaugh et al. |
| 2019/0331941 A1 | 10/2019 | Coolbaugh et al. |
| 2020/0026003 A1 | 1/2020 | Coolbaugh et al. |
| 2020/0158954 A1 | 5/2020 | Coolbaugh et al. |
| 2020/0166703 A1 | 5/2020 | Charles et al. |
| 2020/0166720 A1 | 5/2020 | Charles et al. |
| 2020/0319403 A1 | 10/2020 | Coolbaugh et al. |
| 2020/0379173 A1 | 12/2020 | Coolbaugh et al. |
| 2021/0072568 A1 | 3/2021 | Coolbaugh et al. |

FOREIGN PATENT DOCUMENTS

| | | |
|---|---|---|
| WO | WO2013086047 A1 | 6/2013 |
| WO | 2020256819 A2 | 12/2020 |

OTHER PUBLICATIONS

Intellectual Property Office of Singapore; Search Report, in corresponding SG Application 11202113967S, dated Apr. 22, 2025. 6 pages.

* cited by examiner

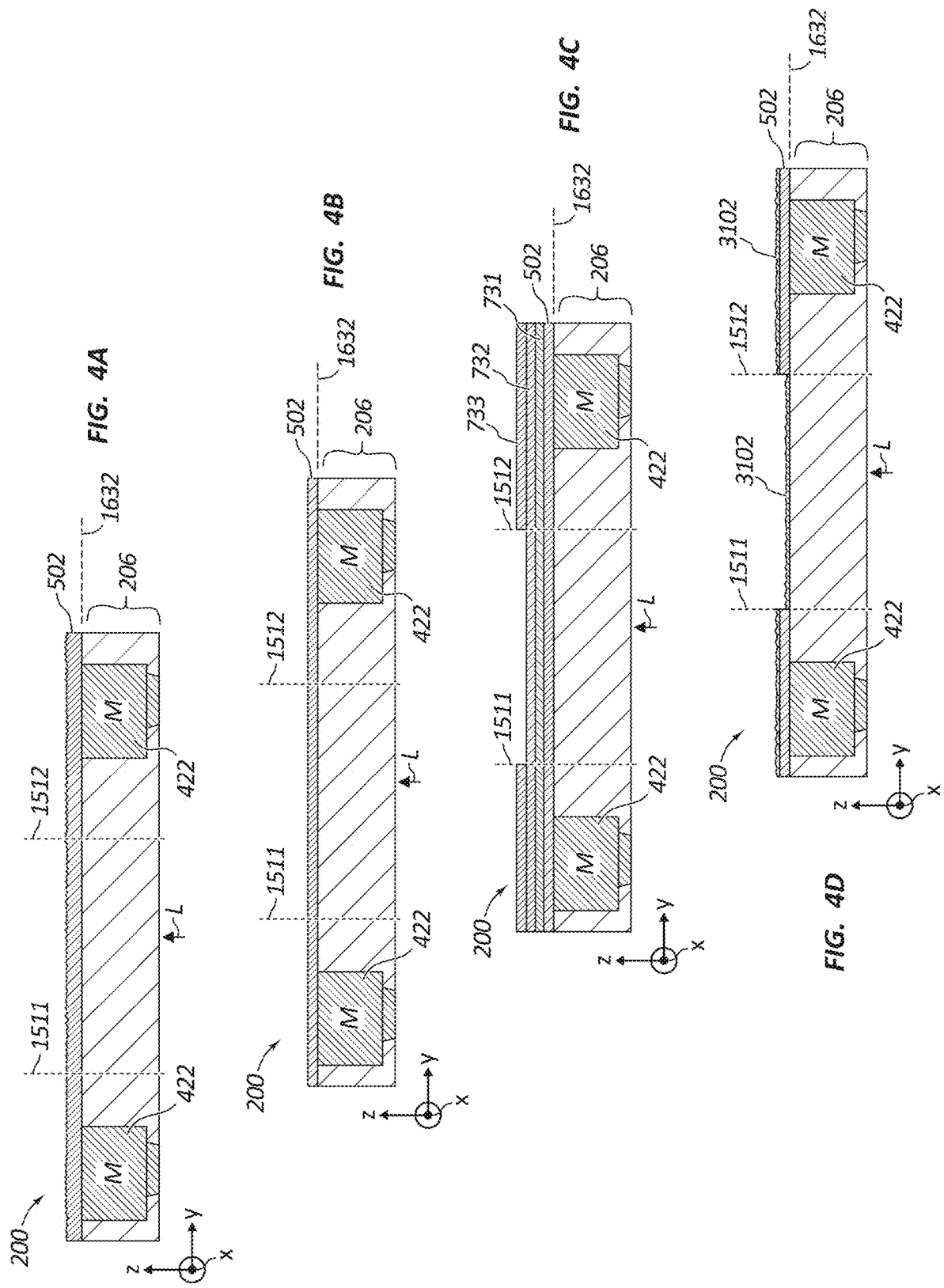

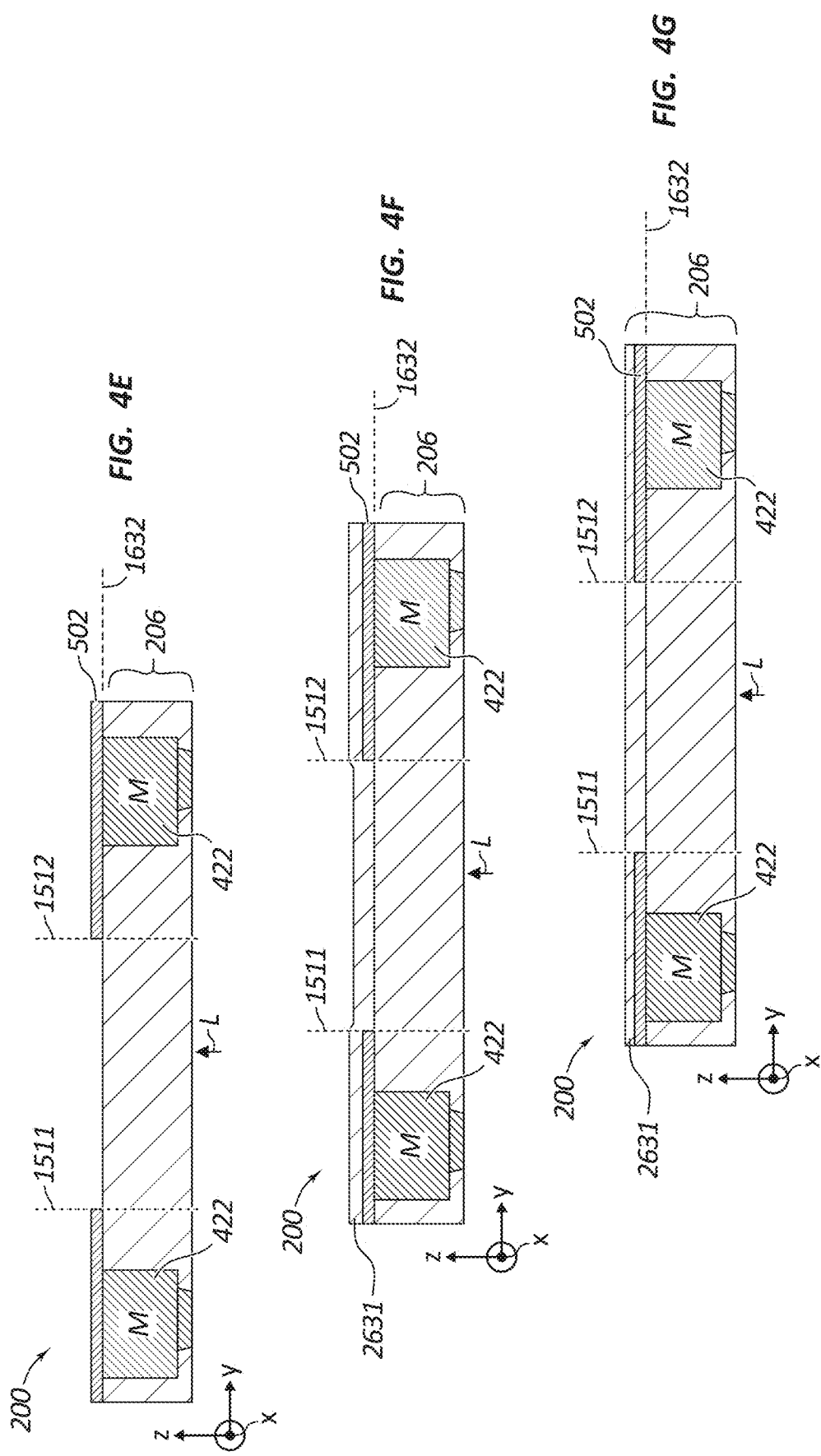

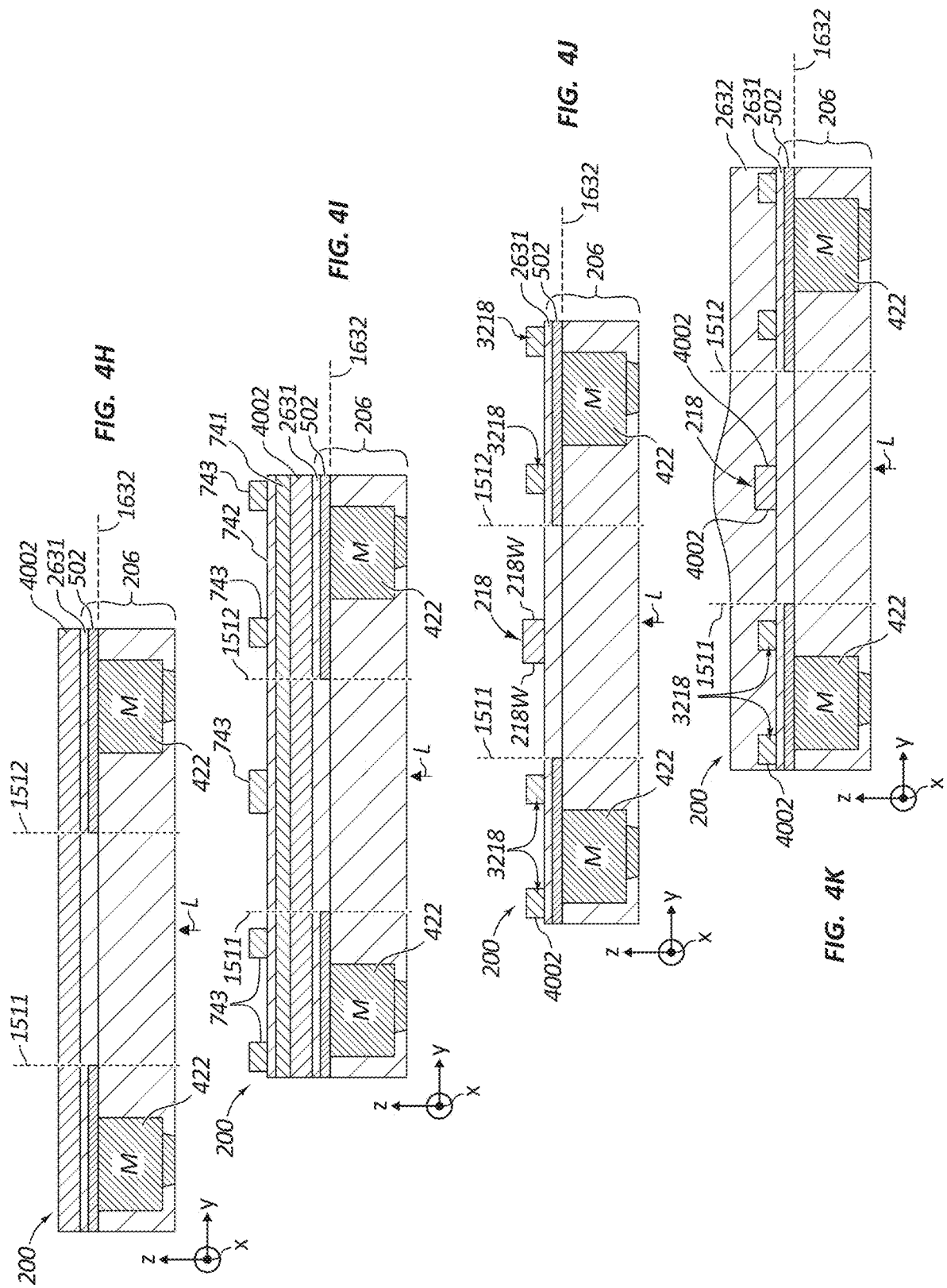

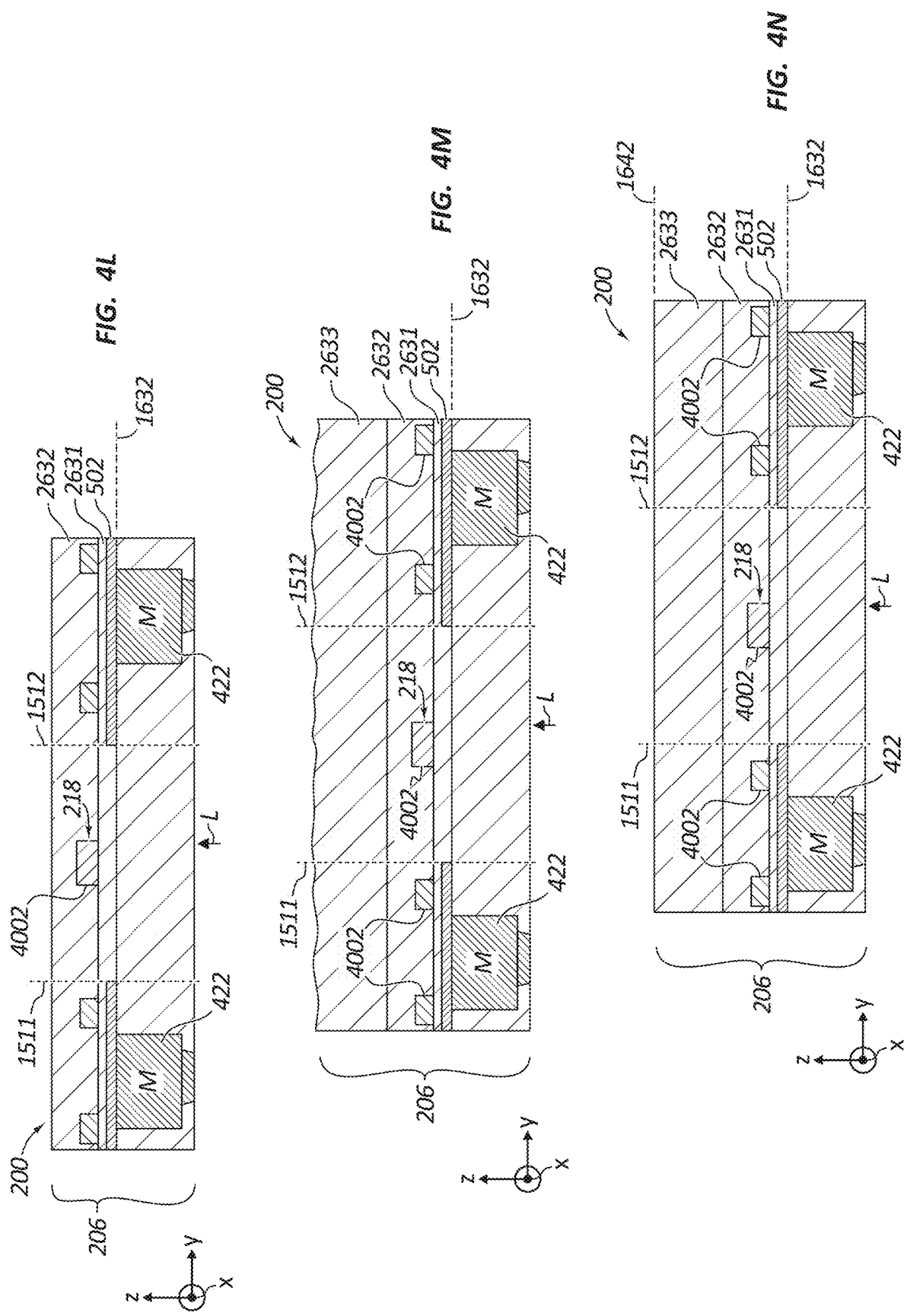

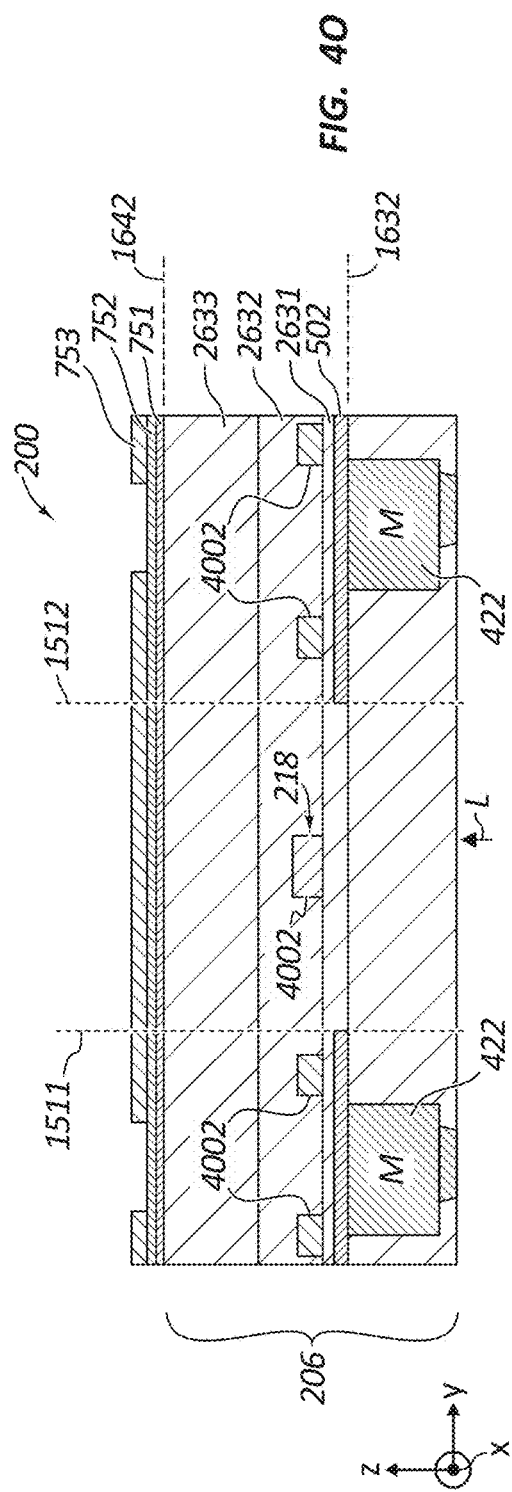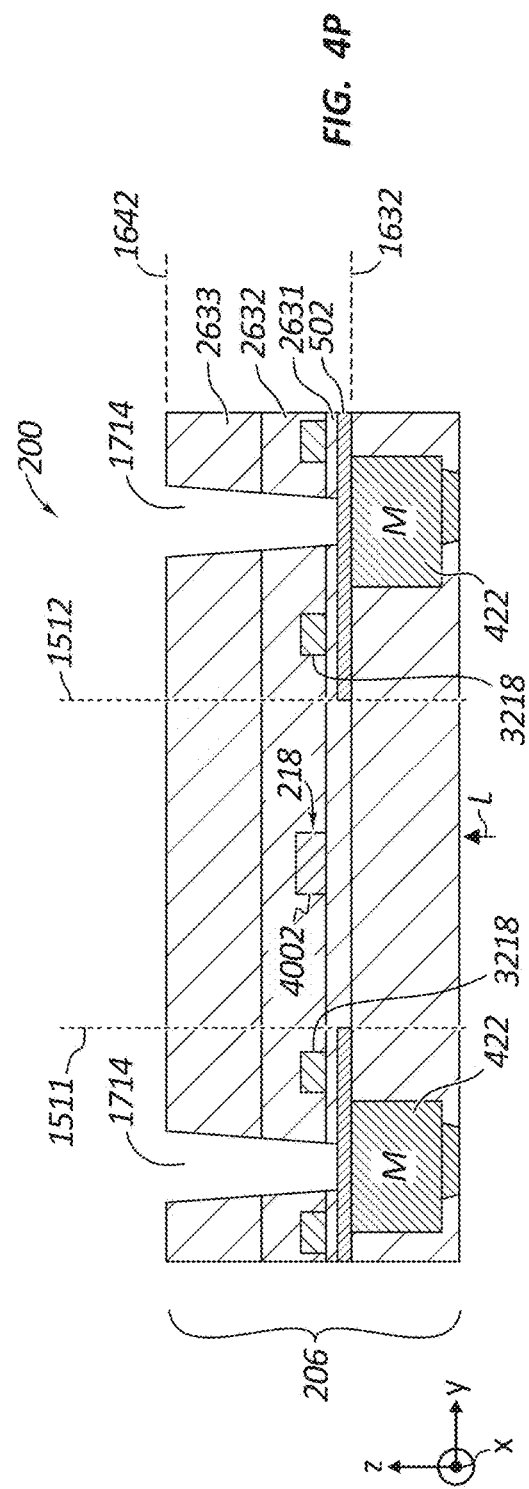

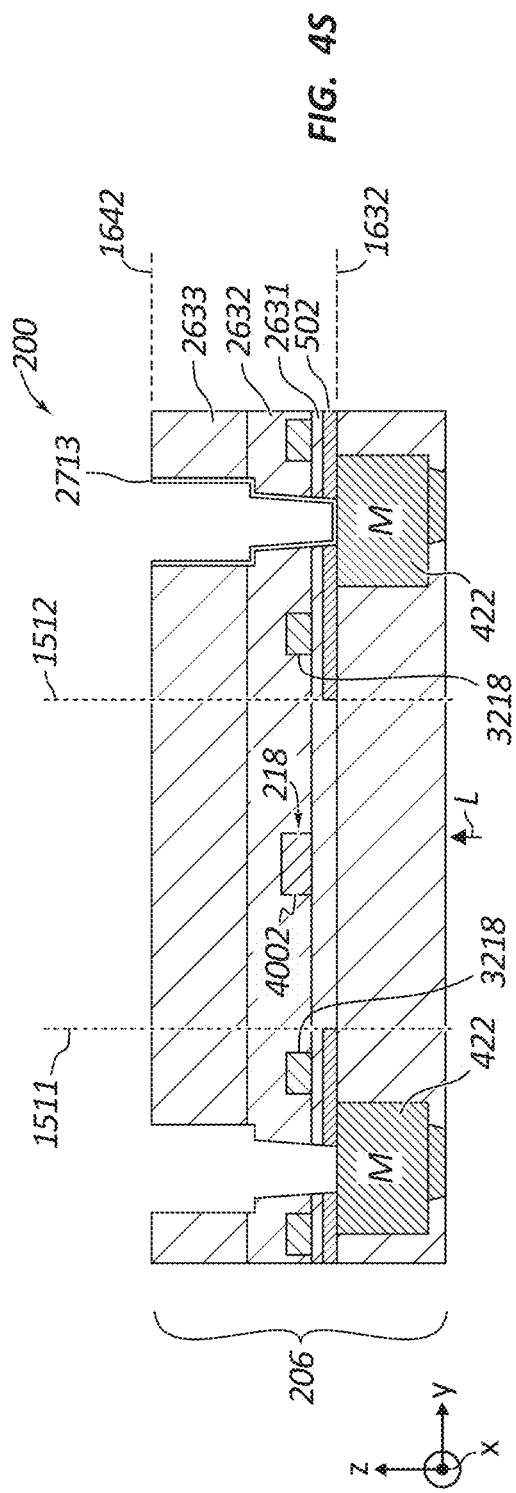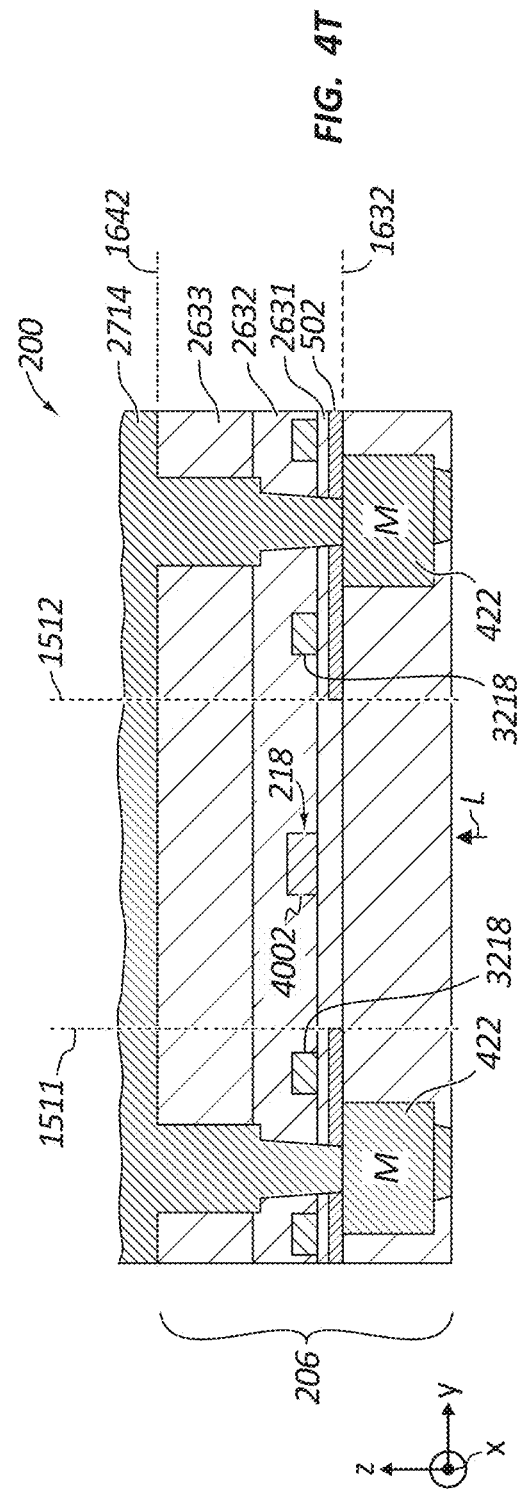

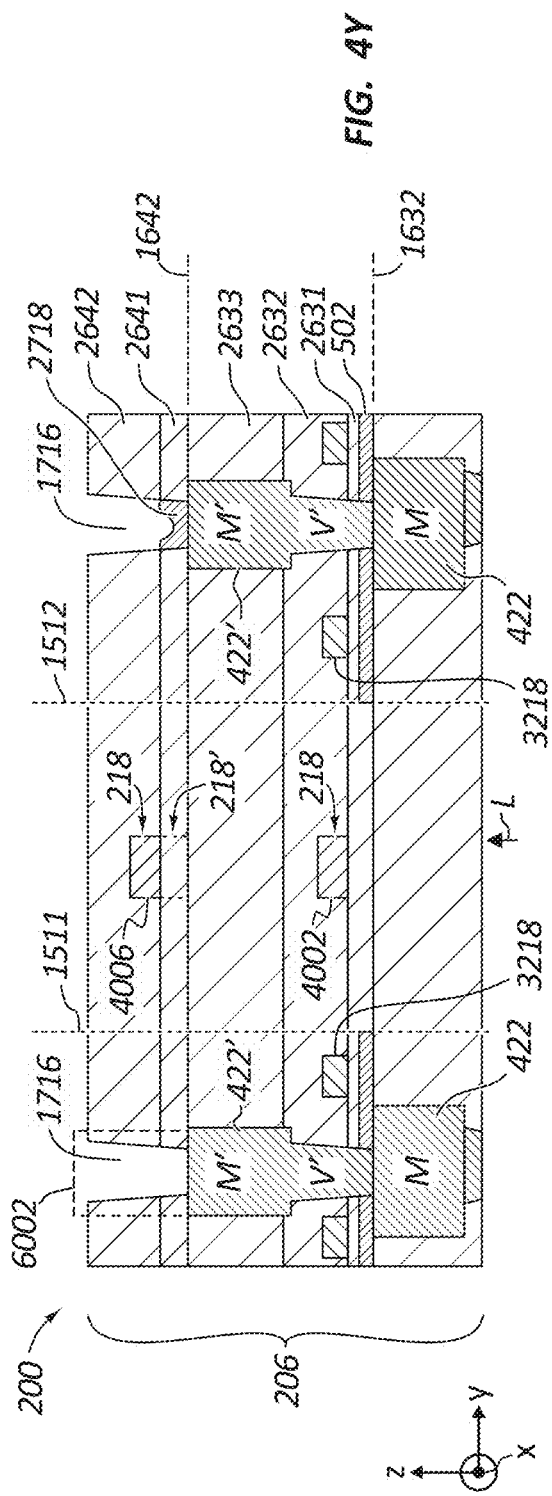
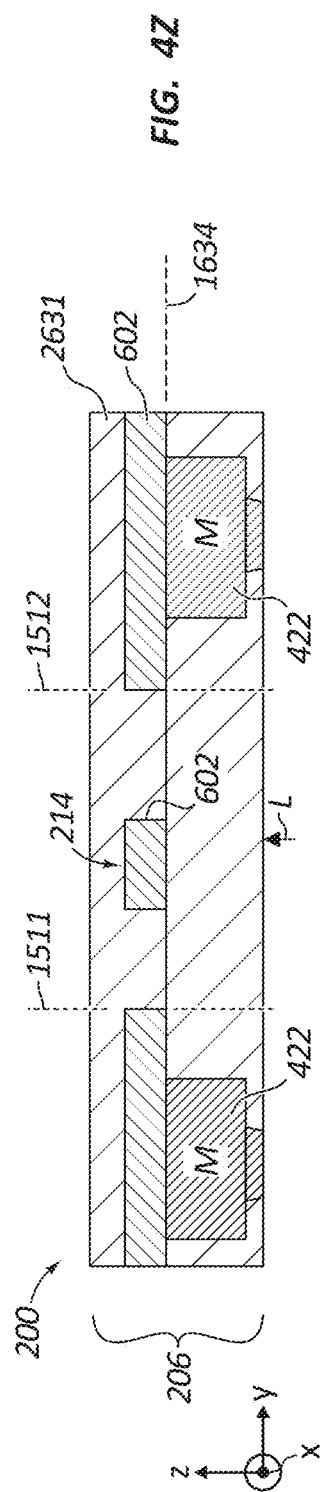
FIG. 4Y
FIG. 4Z

FABRICATING PHOTONICS STRUCTURE CONDUCTIVE PATHWAYS

CROSS-REFERENCE TO RELATED APPLICATIONS

This application is a National Stage application under 35 U.S.C. § 371 of PCT Application No. PCT/US2020/028418, filed Apr. 16, 2020, and published on Dec. 24, 2020 as WO2020/256819, entitled "FABRICATING PHOTONICS STRUCTURE CONDUCTIVE PATHWAYS", which is incorporated by reference herein in its entirety. This National Stage application under 35 U.S.C. § 371 of PCT Application No. PCT/US2020/028418 claims the benefit of priority of U.S. Provisional Application No. 62/862,825 filed Jun. 18, 2019, titled "FABRICATING PHOTONICS STRUCTURE CONDUCTIVE PATHWAYS", which is incorporated by reference herein in its entirety. This National Stage application under 35 U.S.C. § 371 of PCT Application No. PCT/US2020/028418 claims the benefit of priority of Taiwan Application No. 109112443, filed Apr. 14, 2020, titled "FABRICATING PHOTONICS STRUCTURE CONDUCTIVE PATHWAYS", which is incorporated by reference herein in its entirety.

GOVERNMENT RIGHTS STATEMENT

This invention was made with government support under Defense Advanced Research Projects Agency (DARPA) of the United States, under grant contract number HR0011-12-2-0007. The government may have certain rights in the invention.

FIELD

The present disclosure relates to photonics generally and specifically to fabricating of photonics structures.

BACKGROUND

Commercially available photonic integrated circuits are fabricated on wafers, such as bulk silicon or silicon-on-insulator wafers.

In one aspect photonics integrated circuits can include waveguides for transmission of light signals between different areas of a photonic integrated circuit chip as well as on and off the chip. Commercially available waveguides are of rectangular or ridge geometry and are fabricated in silicon (single or polycrystalline) or silicon nitride.

Commercially available photonics integrated circuits can include photodetectors and other optical components. Photonics integrated circuits rely on the emission, modulation and the detection of light in the communication band (about 1.3 µm to about 1.55 µm). A bandgap absorption edge in germanium is near 1.58 µm. Germanium has been observed to provide sufficient photo-response for optoelectronic applications using 1.3 µm and 1.55 µm carrier wavelengths.

Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

There is set forth herein a photonics device including: a photonics dielectric stack on a substrate, the photonics dielectric stack including a dielectric layer and one or more photonics devices having a photosensitive material formation; a first dielectric material layer with a first portion thereof formed over the photosensitive material formation, and a second portion thereof formed over the dielectric layer of the dielectric stack; an etch stop layer over the first layer of dielectric material; and a second dielectric material layer over the etch stop layer, the second dielectric material layer including an etched trench over the photosensitive material formation wherein a bottom of the trench is delimited by the photosensitive material formation.

There is set forth herein a photonics device including: a photonics dielectric stack on a substrate and including a dielectric layer, the photonics dielectric stack including one or more photonics devices having a photosensitive material formation; a first dielectric material layer with a first portion thereof formed over the photosensitive material formation, and a second portion thereof formed over the dielectric layer of the dielectric stack; an etch stop layer over the first layer of dielectric material; a second dielectric material layer on the etch stop layer, the second dielectric material layer including an etched trench over the photosensitive material formation such that a bottom of the trench is delimited by the photosensitive material formation, the trench further including an upper region of wider diameter and a lower region of narrower diameter, the trench further including an aluminum deposit including a top surface thereof that is atomically smooth and planar, the top surface defined by a dielectric layer of the photonics dielectric stack and the aluminum.

There is set forth herein a method including, depositing a layer of dielectric material so that a first portion of the layer of dielectric material is formed on a photosensitive material formation and so that a second portion of the layer of dielectric material is formed on a dielectric layer of a dielectric stack of a photonics structure having one or more photonics device; depositing an etch stop layer on the layer of dielectric material; forming a dielectric material layer on the etch stop layer; performing first etching of the dielectric material layer selective to the etch stop layer to define a trench over the photosensitive material formation; performing second etching of the etch stop layer, wherein the second etching removes material of the etch stop layer through a thickness of the etch stop layer and material of the layer of dielectric material through a portion of a thickness of the layer of dielectric material, the second etching increasing a depth of the trench; and performing plasmaless etching of a remaining thickness of the layer of dielectric material to reveal the photosensitive material formation so that a bottom of the trench is delimited by the photosensitive material formation.

There is set forth herein a method including, depositing one or more layer, wherein the depositing one or more layer includes one or more dielectric layer to extend an elevation of a dielectric stack, wherein a portion of the one or more layer is formed over a conductive material formation and a portion of the one or more layer is formed over dielectric material defining the dielectric stack; etching the dielectric stack to define a trench, the trench being aligned to the conductive material formation; further etching the dielectric stack to widen an upper region of the trench so that the trench has an upper region of wider diameter and a lower region of narrower diameter; depositing in a single deposition stage aluminum into the trench so that with performance the single deposition stage the lower region and the upper region are filled with aluminum, wherein the depositing is performed so that the aluminum overfills the trench; and planarizing an overfill portion of the aluminum so that a top surface of a photonics structure having the dielectric stack in an intermediary stage of fabrication on completion of the planarizing has an atomically smooth planar top surface defined by dielectric material of the dielectric stack and the aluminum.

There is set forth herein a method including, patterning a first layer to define one or more photonics device; performing ion implantation to define one or more ion implantation region in the first layer; depositing one or more dielectric material layer over the first layer; etching the one or more dielectric material layer to define one or more trench in the one or more dielectric layer so that a bottom of a first trench of the one or more trench is aligned to a certain ion implantation region of the one or more ion implantation region; and filling the one or more trench, wherein the filling includes filling the first trench with conductive material so that the conductive material is in electrical communication with the certain ion implantation region, and wherein the conductive material includes aluminum.

There is set forth herein a method including, patterning a waveguiding layer to define a photonics device, the waveguiding layer formed of a waveguiding material; depositing a dielectric layer on the photonics device; subjecting the dielectric layer to chemical mechanical planarization to reduce an elevation of the dielectric layer and subjecting the dielectric layer to chemical mechanical polishing so that the dielectric layer defines an atomically smooth surface; depositing a second dielectric layer on the atomically smooth surface; subjecting the second dielectric layer to chemical mechanical planarization to reduce an elevation of the second dielectric layer and subjecting the second dielectric layer to chemical mechanical polishing so that the second dielectric layer defines an atomically smooth dielectric surface; depositing a second waveguiding layer over the atomically smooth dielectric surface; and patterning the second waveguiding layer to define a second photonics device.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Various fabrication processes for fabrication of conductive pathways in a photonics structure are set forth herein.

A process for trench formation and for the formation of conductive material on photosensitive material of a photodetector 240 is described with reference to area the fabrication stage view of FIGS. 1A-1J.

There is described in reference to FIGS. 1A-1J, a process for conductive material contact formation for fabrication of a photonics device, e.g. a photodetector photonics device wherein a conductive material formation is in contact with a photosensitive material, such as can be provided by germanium. In FIGS. 1A-1J, there is depicted a photodetector 240 having a photosensitive material formation 242 which can be provided by a germanium formation. The process described with reference to FIGS. 1A-1F in one embodiment can provide for a "soft landing" of conductive material onto photosensitive material formation 242. The soft landing process provides for minimal risk of imposing of defects on photosensitive material formation 242.

Figure 1A:
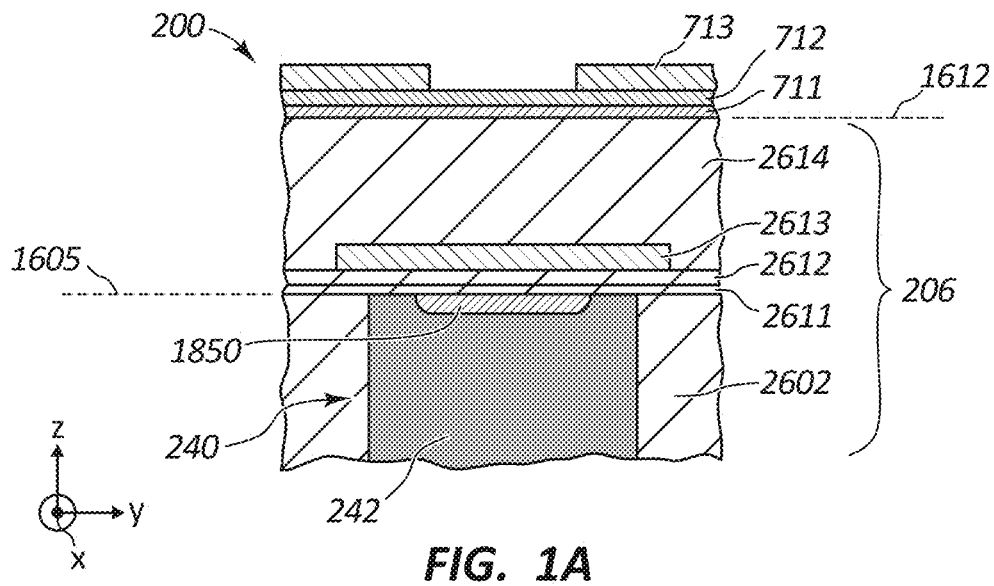
FIGS. 1A-1J are fabrication stage views illustrating fabrication of a photodetector in a photonics structure according to one embodiment.

In the stage view depicted in FIG. 1A, there is shown photonics structure 200 having photodetector 240 with photosensitive material defining photosensitive material formation 242 deposited, planarized, and smoothed to define a planar top surface extending in a horizontal plane at elevation 1605. Photosensitive material formation 242 which can be provided by a germanium formation can have an ion implantation region 1850.

Referring to the stage view of FIG. 1A, there can be deposited layer 2611. A portion of layer 2611 can be deposited on photosensitive material formation 242 and a portion of layer 2611 can be deposited on layer 2602. On layer 2611 there can be deposited layer 2612. On layer 2612 there can be deposited layer 2613. On layer 2613 there can be deposited layer 2614. In the embodiment depicted in the fabrication stage view of FIG. 1A, layers 2602, 2611, 2612, and 2614 can be formed of dielectric material e.g. oxide such as $SiO_2$. Layer 2613 in one embodiment can be an etch stop layer provided, e.g. by silicon nitride (SiN).

Embodiments herein recognize that while providing layer 2613 to be formed of SiN provides advantages in terms of etch stop functioning, optical signals propagating within photonics structure 200 can couple to nitride based structures. A method herein can include patterning layer 2613 provided by an etch stop layer so that no light signal propagating within the photonics structure 20 is coupled to layer 2613. A method herein can include patterning layer 2613 providing an etch stop layer so that the etch stop layer is optically isolated from one or more of the following selected from the group consisting of (a) one or more photonics device of the photonics structure, (b) a certain photonics device of the photonics structure, (c) a plurality of photonics devices of the photonics structure, and (d) each photonics device of the photonics structure. According to one embodiment, to prevent coupling of layer 2613 to one or more external photonics device of photonics structure, layer 2613 can be patterned to be locally formed, e.g. to feature a truncated length as shown in FIG. 1A, wherein layer 2613 has left and right ends as depicted in FIG. 1A substantially aligned to and above respectively, a left and right section of a depicted sidewall of the depicted trench (1810 in FIG. 1G) in which photosensitive material formation 242 is formed.

Layers 2602, 2611, 2612, 2613, and 2614 can be deposited using plasma enhanced chemical vapor deposition (PECVD) at a reduced temperature range, e.g. at a temperature range of from about 300° C. to about 500° C. Subsequent to the depositing of each layer 2602, 2611, 2612, 2613, and 2614 the respective layer can be subject to chemical mechanical planarization (CMP planarization) so that a top surface of the deposited layer subsequent to the deposition is planar and extends in a horizontal plane that runs parallel to the X-Y plane depicted in the referenced coordinate system associated to FIG. 1A.

The CMP planarization can be accompanied by chemical mechanical polishing (CMP polishing) so that the top surface subject to CMP polishing can be atomically smooth. All CMP planarization stages herein can be accompanied by a CMP polishing stage. The CMP planarizing stage can create a horizontally extending planar surface. The accompanying CMP polishing stage can define an atomically smooth surface. In all sections of the current disclosure where planarization is described, the planarization can be provided by CMP planarization that reduces an elevation of the surface being subject to planarization and results in the surface being subject to planarization being a planar surface that extends horizontally. In all sections of the current disclosure where planarization is described, the planarization can be accompanied by polishing provided by CMP polishing that results in the surface being subject to CMP polishing being atomically smooth.

Layer 2611 can be provided in one embodiment by an oxide ion implantation screening layer to facilitate ion implantation and formation of ion implantation region 1850 of photosensitive material formation 242. As set forth herein a plurality of adjacent layers can be regarded as "a layer" of which each layer of the plurality of adjacent layers is a sublayer.

Still referring to the fabrication stage view of FIG. 1A, the photolithography stack comprising layers 711, 712, and 713 can be deposited on layer 2614 subsequent to the planarization and polishing of layer 2614 so that a top surface of layer 2614 defines a planar and smooth surface extending in a horizontal plane at elevation 1612. The photolithography stack depicted in the fabrication stage view of FIG. 1A can include layer 712 deposited on layer 711 and layer 713 deposited on layer 712. Layer 711 can be an organic planarization layer (OPL), layer 712 can be a silicon containing anti-reflective coating layer (SIARC), and layer 713 can be a resist layer. The pattern of layer 713 can be defined using a photolithography tool that includes a photolithography mask. On exposure of layer 713 using the photolithography tool, layer 713 is patterned according to the pattern of the mask.

Figure 1B:
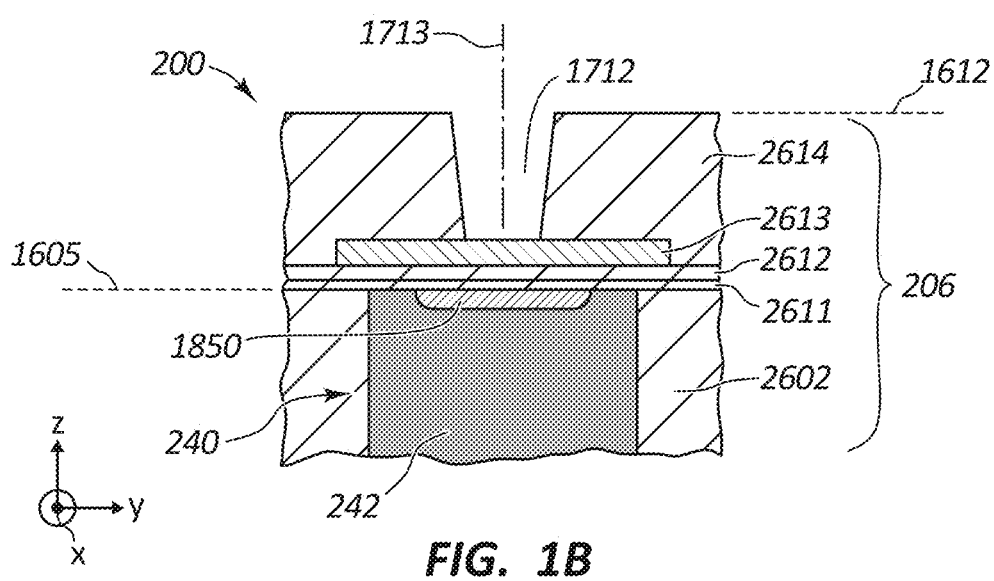

FIG. 1B illustrates photonics structure 200 as shown in FIG. 1A in an intermediary stage of fabrication subsequent to etching of material of layer 2614 using the pattern of layer 713. In the fabrication stage view depicted in FIG. 1B, layer 2614 is etched selectively to the material of layer 2613 so that material of layer 2613 is not etched in the stage view depicted in FIG. 1B. On the performance of the etching depicted in the fabrication stage view of FIG. 1B to remove material of layer 2614, trench 1712 having vertically extending center axis 1713 can be defined.

Figure 1C:
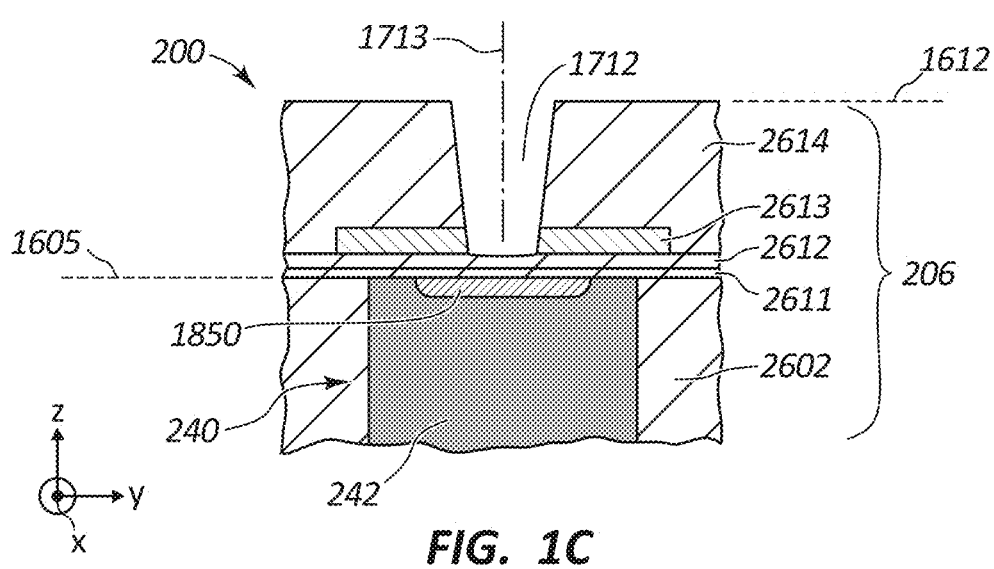

FIG. 1C illustrates photonics structure 200 as depicted in FIG. 1B in an intermediary stage of fabrication subsequent to further etching for removal of material of layer 2613 selective to the material of layer 2612 so that material of layer 2613 (formed of an etch stop material, such as SiN) can be removed with modest recessing of the layer defined by layer 2611 and layer 2612. In one embodiment the layer defined by layer 2611 and layer 2612 can have a thickness of between about 20 nm and 100 nm and in one embodiment between about 40 nm and about 60 nm. In one embodiment, layer 2611 can have a thickness of between about 5 nm and about 15 nm. In the intermediary stage depicted in FIG. 1C, a bottom of trench 1712 can be defined by layer 2612.

Figure 1D:
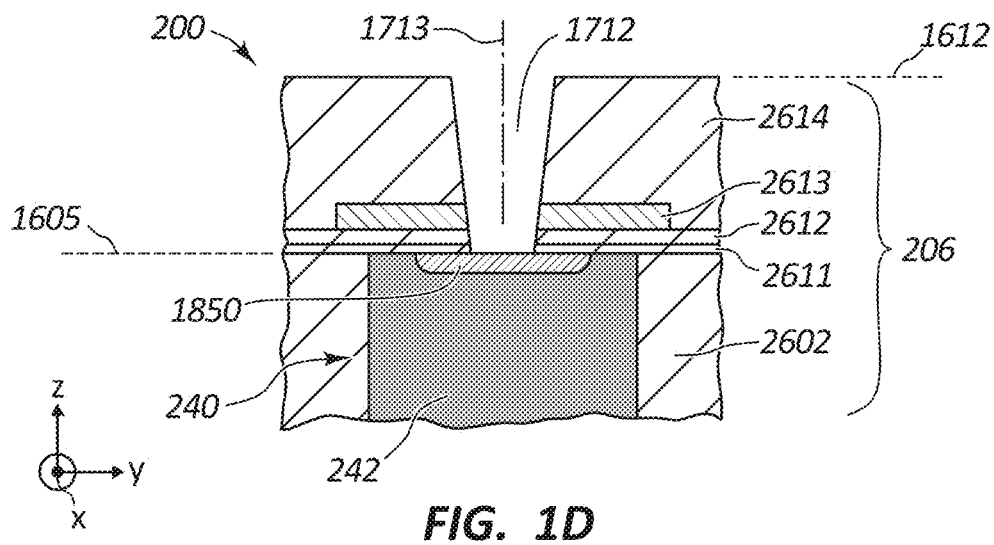

FIG. 1D illustrates photonics structure 200 as depicted in FIG. 1C in an intermediary stage of fabrication subsequent to removal of material of layer 2611 and 2612 from trench 1712 remaining between a bottom of trench 1712 and a top surface of photosensitive material formation 242. On completion of the stage depicted in FIG. 1D, a top surface of photosensitive material formation 242 occupied by ion implantation region 1850 can be revealed. In the intermediary stage depicted in FIG. 1D, a bottom of trench 1712 can be defined by an ion implantation area 1850 of photosensitive material formation 242

Performance for removal of material of layers 2611 and 2612 from trench 1712 is depicted in FIG. 1D. A plasmaless gaseous etching process can be utilized. Embodiments herein recognize that a plasmaless gaseous etching process for removal of material of layer 2611 and layer 2612 can reduce defects imposed to a top surface of photosensitive material formation 242 at ion implantation region 1850 thereof. A plasmaless gaseous etching process in one embodiment can include use of first and second treatment chambers. A first treatment chamber can be a chemical treatment chamber in which photonics structure 200 in the intermediary stage of fabrication shown, can be exposed to a gaseous compound, e.g. $HF/NH_3$. Exposure to the gaseous compound can be under controlled conditions that include surface temperature and gas pressure. The second treatment chamber can be a heat treatment chamber, which can sublimate biproducts of the reaction in the first treatment chamber. The first treatment chamber can be used to perform a surface microetch to remove material of layer 2611 and layer 2612 within trench 1712. With use of the first chamber there can be performed $HF/NH_3$ adsorption onto the surfaces of layers 2611 and 2612. The first treatment chamber can have a chamber temperature of between about 20° C. and 40° C. With use of the second treatment chamber, photonics structure 200 in the intermediary stage of fabrication shown can be heated up to a temperature of between about 100° C. and 200° C. to evaporate biproducts resulting from use of the first treatment chamber. In one embodiment, a plasmaless etching process as set forth herein can include a chemical oxide removal process.

In one embodiment, etching parameters can be provided so that by the etching as depicted in FIG. 1D between about 20% and about 80% of a thickness of the layer defined by sublayer layers 2611 and 2612 can be removed (between about 80% and about 20% of the layer defined by sublayers 2611 and 2612 can be removed by the etching depicted in FIG. 1C). In one embodiment, between about 40% and about 60% of a thickness the layer defined by sublayer layers 2611 and 2612 can be removed by the etching that is depicted in FIG. 1D (between about 60% and about 40% of the layer defined by sublayers 2611 and 2612 can be removed by the etching depicted in FIG. 1C). In one embodiment, between about 5% and about 95% of a thickness the layer defined by sublayer layers 2611 and 2612 can be removed by the etching that is depicted in FIG. 1D (between about 95% and about 5% of the layer defined by sublayers 2611 and 2612 can be removed by the etching depicted in FIG. 1C).

Figure 1E:
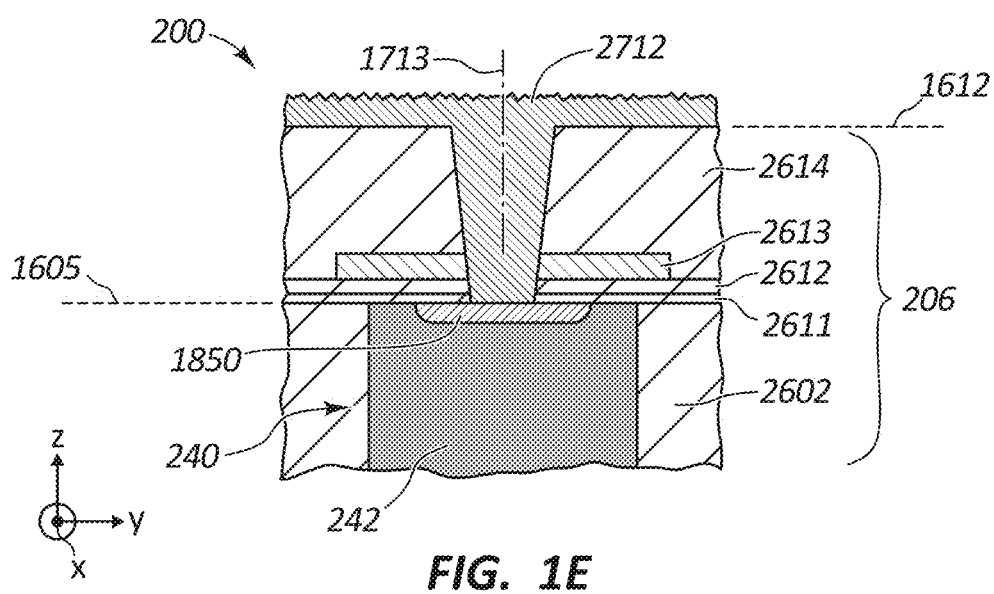

FIG. 1E illustrates photonics structure 200 as shown in FIG. 1D in an intermediary stage of fabrication subsequent to deposition of conductive material 2712 within trench 1712 (FIGS. 1B-1D). In one embodiment conductive material 2712 can be formed of aluminum (Al).

Deposition of conductive material 2712 can include use of physical vapor deposition (PVD). With use of PVD a material being deposited transitions from a condensed phase to a vapor phase and then back to a thin film condensed phase. A PVD process can include sputtering and evaporation. Deposition of conductive material 2712 can be performed so that conductive material 2712 covers (in the intermediary stage of fabrication as shown in FIG. 1E) an entire top surface of a wafer on which photonics structure 200 is fabricated. A wafer on which photonics structure 200 can be fabricated can be provided by a silicon on insulator (SOI) wafer having a substrate 100, layer 202 provided by an insulator layer, layer 201 provided by a silicon layer as set forth herein further in reference to FIG. 2A. Various photonics devices e.g. waveguides, photodetectors, gratings, and/or modulators can be fabricating by processing that includes patterning of layer 201 formed of silicon.

Figure 1F:
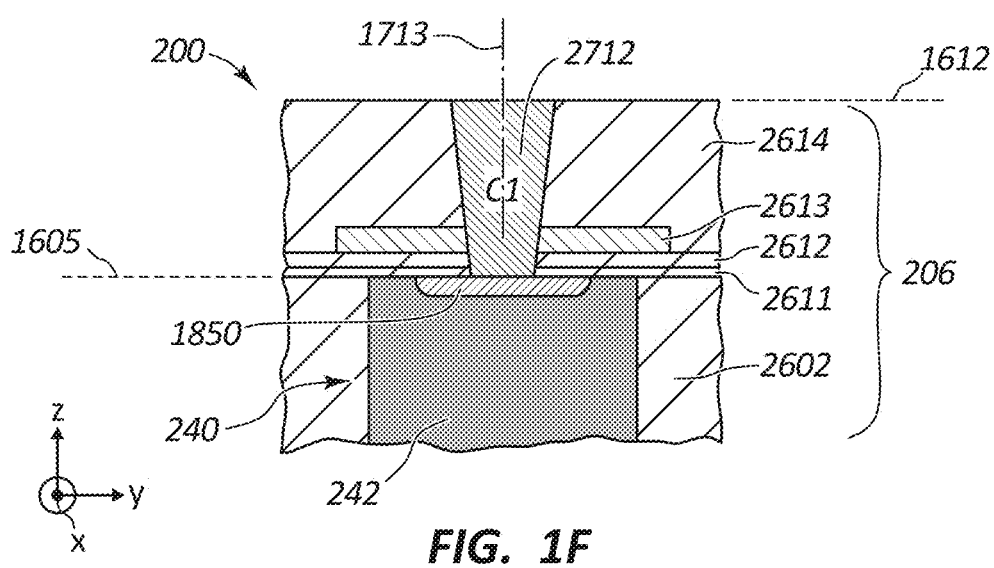

FIG. 1F illustrates photonics structure 200 as shown in FIG. 1E in an intermediary stage of fabrication after planarization of photonics structure 200. Planarization depicted in the intermediary fabrication stage view of FIG. 1F can include CMP planarization to reduce an elevation of photonics structure 200 to elevation 1612 as depicted in FIG. 1F. CMP planarization can be performed to reduce an elevation of conductive material 2712 until a top surface of photonics structure 200 is defined by conductive material formation C1 and layer 2614 is revealed as depicted in FIG. 1F. Planarization as depicted in FIG. 1F can be performed so that a top surface of photonics structure 200 as depicted in the intermediary stage view of FIG. 1F is partially defined by conductive material 2712 and partially defined by layer 2614 which top surface can be planarized and can extend in a horizontal plane parallel to the X-Y plane of the depicted referenced coordinate system. CMP planarization can be accompanied by CMP polishing so that a top surface of photonics structure 200 in the intermediary stage view depicted in FIG. 1F partially defined by conductive material 2712 and partially defined by layer 2614 is atomically smooth.

On the planarization of photonics structure 200 as depicted in FIG. 1F, conductive material 2712 defines conductive material formation C1 formed within trench 1712 (FIGS. 1B-1D).

In one embodiment, photonics structure 200 can be adapted for detection of light in the communications wavelength range. A method for fabricating a photonics structure 200 having a photodetector is as follows. According to a method in one embodiment, there is performed (1) forming a dielectric stack having one or more layer of dielectric material over a silicon waveguide and etching a trench in the dielectric stack extending to the silicon waveguide. There can be performed (2) epitaxially growing germanium within the trench and (3) annealing germanium formed by the epitaxial growing. There can be performed repeating of the epitaxial growing and annealing until the germanium overfills the trench sufficiently.

As a result of performance of the method there can be formed a germanium based photodetector that can be absent of a low-temperature buffer layer connecting the germanium formation to the silicon surface. The resulting photonics structure 200 defining a photodetector provides for low leakage current and increased signal to noise ratio.

Figure 1G:
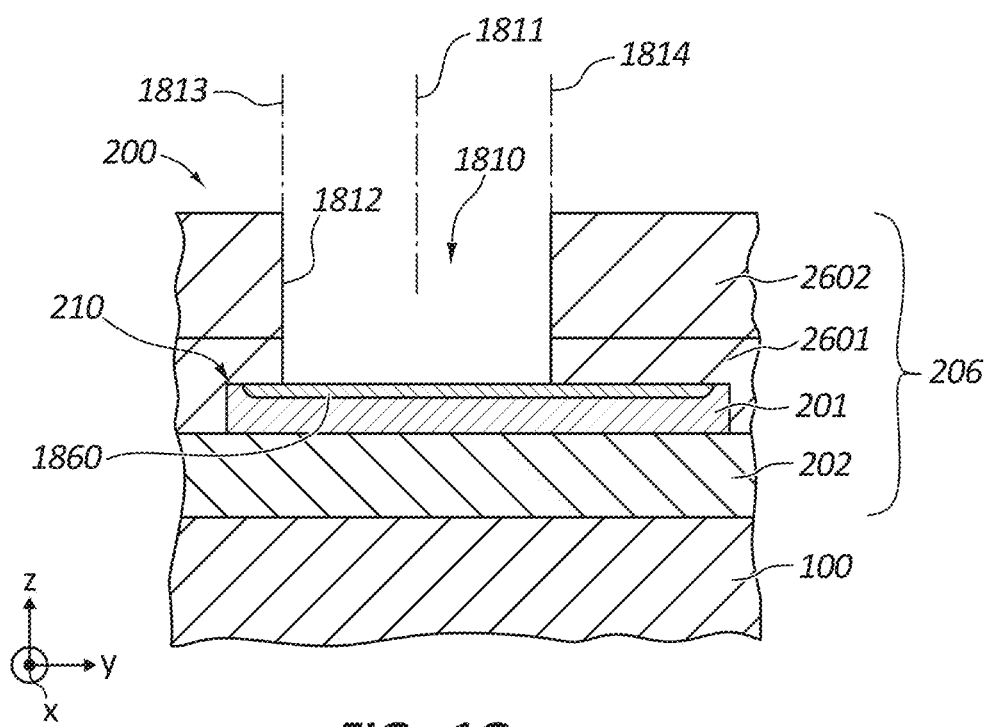
Figure 1H:
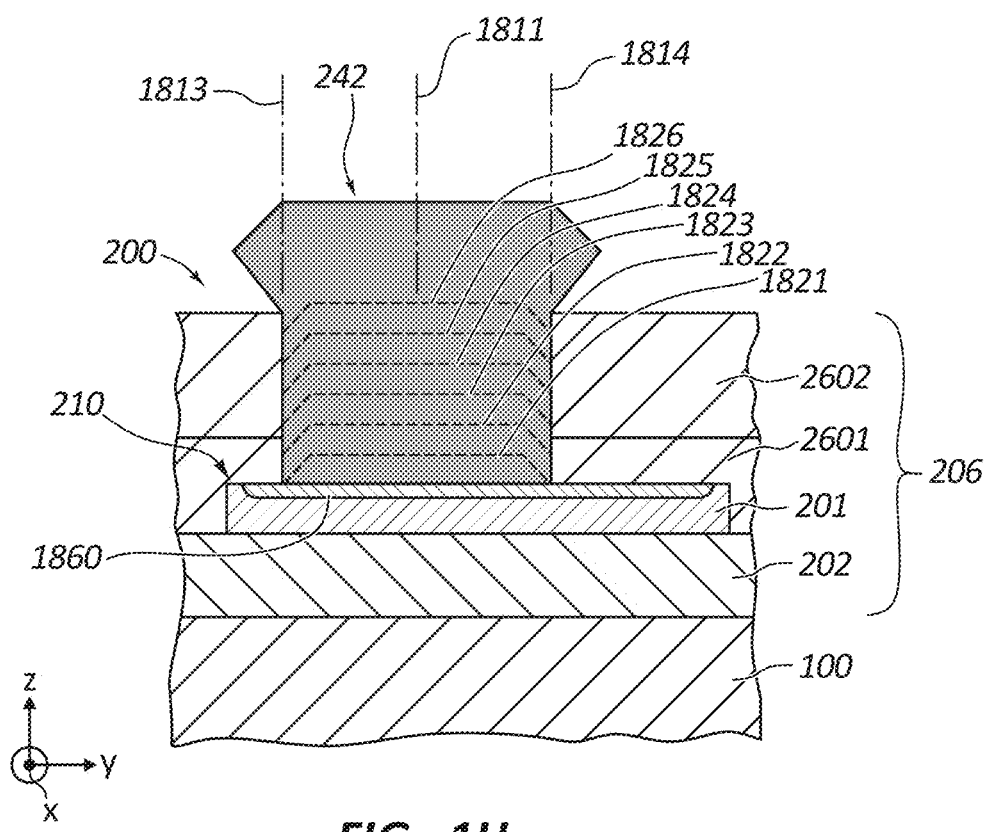

Further aspects of the method are described with reference to FIGS. 1G-1H showing a photonics structure 200 in various intermediary stages of fabrication. There is set forth herein a silicon photonics structure and process wherein vertical photodetector integrated on a silicon-on-insulator (SOI) wafer having substrate 100, layer 202 provided by an insulator layer and layer 201 formed of silicon can be patterned to define waveguides such as waveguide 210 formed of silicon. In one embodiment, a vertical photodetector can be integrated on a SOI top silicon waveguiding level by patterning trenches within a layer of dielectric material, e.g., oxide, filling with crystalline germanium, planarizing the overfill of the germanium, and forming top and bottom contacts.

FIG. 1G depicts photonics structure 200 in an intermediary stage of fabrication that illustrates performance of forming dielectric material on and about a silicon waveguide and patterning a trench. Photonics structure 200 can include a substrate 100 formed of silicon, a layer 202 formed of buried oxide, a waveguide 210 of which a detector plateau section is shown in FIG. 1G, a waveguide 210, and a layer 2601 which can be a cladding layer formed of dielectric material e.g. oxide formed on and about waveguide 210, which waveguide can be patterned in and defined by waveguiding layer 201 which can be formed of silicon. Dielectric stack 206 formed over waveguide 210, which can include layer 2601 which can be a cladding layer and layer 2602 which can be a capping layer. Layer 2601 and layer 2602 can have a combined thickness of greater than about 500 nm, and in one embodiment between about 500 nm and about 1500 nm. In one embodiment, layer 2601 provided by a cladding layer in combination with layer 2602 provided by a capping layer has a combined thickness of about 1000 nm so that a height of a formed photodetector structure has a height of about 800 nm to about 1000 nm.

Waveguide 210 of photodetector 240 can be defined by patterning of layer 201 formed of silicon. Layer 201 can be a silicon layer of prefabricated silicon on insulator (SOI) wafer having substrate 100, layer 202 provided by an insulator layer and layer 201 provided by a silicon layer.

Further details of formation of trench 1810 are set forth with reference to FIG. 1G. Photonics structure 200 as shown in FIG. 1G is illustrated after formation of trench 1810 providing a detector trench which can be patterned to extend to an underlying waveguide 210 provided by a silicon waveguide. Patterning may be performed using e.g. one or more of lithography, dry etching, or wet chemical processing. In one embodiment, a formed trench 1810 can have a depth of greater than about 500 nm, and in one embodiment in the range of from about 500 nm and about 1500 nm. In one embodiment, trench 1810 can have a depth of about 800 nm to about 1000 nm.

Further details of the stage of epitaxially growing and the stage of annealing and of the repeating of epitaxial growing an annealing are set forth with reference to FIG. 1H illustrating a photonics structure 200 in an intermediary stage of fabrication wherein a photosensitive material formation provided by a germanium formation overfills trench 1810.

Prior to performance of epitaxially growing of germanium the photonics structure 200 as shown in FIG. 1G can be subject to an ex-situ and/or in-situ surface cleaning process consisting of a wet chemical or dry native oxide removal followed by a short in-situ high-temperature bake in a reducing hydrogen atmosphere. The latter can be responsible for removing sub-stoichiometric surface oxide reformed by exposure to air between the cleaning tools and epitaxial reactor.

FIG. 1H illustrates the photonics structure 200 of FIG. 1G after formation of germanium within a trench 1810. By epitaxial growing and annealing of germanium, trench 1810 patterned in dielectric stack 206 can be filled with doped or intrinsic crystalline germanium.

Referring to the epitaxially growing stage and the annealing stage sections of germanium can be selectively grown and annealed within trench 1810. In one embodiment, germanium can be selectively grown using reduced pressure chemical vapor deposition (RPCVD). Referring to the stage of epitaxially growing of germanium a multi-step high-rate deposition process can be performed at a temperature of between about 550 to about 850 degrees Celsius and at a pressure of between about 10 Torr and about 300 Torr using germane and Hz as the precursor and carrier gas, respectively. The temperature can be a stable temperature or a variable temperature. The pressure can be a stable pressure or a variable pressure. Epitaxially growing can be performed without use of a doping gas (e.g. diborane for p-type, arsine or phosphine for n-type). In one particular embodiment, about 200 nm of intrinsic (or doped) Ge can be grown selectively (to elevation 1824) using germane and hydrogen at a temperature in the temperature range of between about 550 degrees Celsius to about 700 degrees Celsius and at a pressure in the temperature range of between about 10 Torr to about 25 Torr.

Referring to the annealing in one embodiment a deposition chamber can be purged and the germanium deposited by epitaxially growing can be annealed at a temperature of between about 1850 degrees Celsius to about 850 degrees Celsius and at a pressure of between about 100 Torr and about 600 Torr (300 Torr in one embodiment). The temperature can be a stable temperature or a variable temperature. The pressure can be a stable pressure or a variable pressure.

A germanium film formed by epitaxially growing and annealing can include intrinsic germanium or doped germanium. For doping of formed germanium, dopant gases (such as diborane, phosphine, arsine) can be added to the source gas, e.g., Hz, used during RPCVD epitaxial growing.

Referring the method for photodetector formation (epitaxially growing and annealing) can be repeated until deposited germanium sufficiently overfills trench 1810. In one embodiment, an overfill can be regarded to be sufficient when an overfill allows appropriate corner coverage. In one embodiment, six epitaxially growing and annealing cycles (about 200 nm each) can be used to overfill trench 1810. For example, after a first (initial) epitaxially growing and annealing cycle, deposited germanium can extend to elevation 1821 as shown in FIG. 1H. After a second epitaxially growing and annealing cycle, deposited germanium can extend to elevation 1822. After a third epitaxially growing and annealing cycle, deposited germanium can extend to elevation 1823. After a fourth epitaxially growing and annealing cycle, deposited germanium can extend to elevation 1824. After a fifth epitaxially growing and annealing cycle, deposited germanium can extend to elevation 1825. After a sixth epitaxially growing and annealing cycle, deposited germanium can extend to elevation 1826 and can overfill trench 1810 as is depicted in FIG. 1H. The misfit of the Ge to the Si lattice due to atomic size results in a vast amount of strain-related crystal defects that can extend well past the initial growth interface. The annealing within each growing and annealing cycle can serve to annihilate dislocations and other extended defects inside photosensitive material formation 242.

Trench 1810 can be concentrically formed about vertically extending center axis 1811 and can have vertically extending sidewall 1812 defined by dielectric material of dielectric stack 206. Vertically extending sidewall 1812 can enter vertically extending planes 1813 and 1814. An overfill portion of photosensitive material formation 242 can extend laterally outwardly from vertically extending planes 1813 and 1814 as depicted in FIGS. 1G and 1H.

As noted epitaxially growing and annealing can be repeated in a cycle until the desired fill height is achieved which can occur e.g. when deposited germanium sufficiently overfills trench 1810. It was observed that epitaxial germanium can grow at much reduced rates in the <202> and <111> crystal directions relative to the vertical <100> direction. This lag in epitaxial growth near the edges and corners of trench 1810 can be overcome by overfilling trench 1810. In one embodiment, an overfill of about 1.0 μm can be used to ensure high quality fill of trench edges and corner points. After six cycles in the embodiment depicted in FIG. 1H, the top of the <100> Ge growth front has reached the top of trench 1810. For final processing, a 0.5 μm overfill deposition/annealing cycle followed by a 0.5 μm final growth can be employed to finalize the Ge fill. Finalizing the growth/annealing sequence with growth rather than annealing can be advantageous due to observed redistribution of the Ge feature, especially near the corner points.

In an alternative method described with reference to the intermediary fabrication stage depicted in FIG. 1H, a silicon germanium (SiGe) or Ge buffer layer can be formed on a top surface of waveguide 210 provided by a silicon waveguide prior to formation of germanium (Ge). A SiGe or Ge buffer can be deposited using reduced pressure chemical vapor deposition (RPCVD) at temperatures in the range of from about 300 degrees Celsius to about 450 degrees Celsius. Such processing can be useful in various embodiments. In one embodiment, a formed SiGe or Ge buffer can be in-situ doped (n type or p-type). For formation of a SiGe or Ge buffer, silane ($SiH_4$) can be used as Si source gas and germane ($GeH_4$) can be used as a Ge source gas. For formation of doped buffer layer, diborane ($B_2H_6$), phosphine ($PH_3$), or arsine ($AsH_3$) can be used as doping gases. However, it was observed that the aforementioned low temperature range can furnish excessively low growth rates and can necessitate disproportionately long process durations. In addition, reactor and gas purity requirements can become increasingly stringent as temperature is lowered.

With the method set forth a resulting photonics device provided by photodetector 240 can be absent of a challenging low-temperature SiGe or Ge buffer and can rather include germanium formed adjacent to and directly on a waveguide e.g. waveguide 210 which can be formed of silicon. According to the method provided for photodetector fabrication, the formed photonics structure 200 for use in a photodetector structure that is absent a low-temperature SiGe or Ge buffer can feature a reduced amount of extended defects and therefore reduced reverse leakage current—important for efficiency and speed of detection of light.

The method for photodetector fabrication is particularly adapted for use in creating germanium formations in trenches having widths of less than about 150 μm. Trenches having widths of greater than about 150 µm can exhibit a reduced fill height as well as severe surface roughening. Because common optical device trench widths in photonic devices are less than about 10 µm, the method is well suitable for use with a wide range of photonic devices. It was observed that restricting an area for growth of germanium e.g. to an area defined by a width of trench 1810 can reduce formation of anomalous features and can facilitate growth of germanium on a layer of silicon without a low-temperature SiGe or Ge buffer between a germanium formation and a silicon layer. Trench 1810 can have a width of less than about 10 µm and in one embodiment can feature excellent fill character to widths as small as 200 nm or smaller.

Figure 1I:
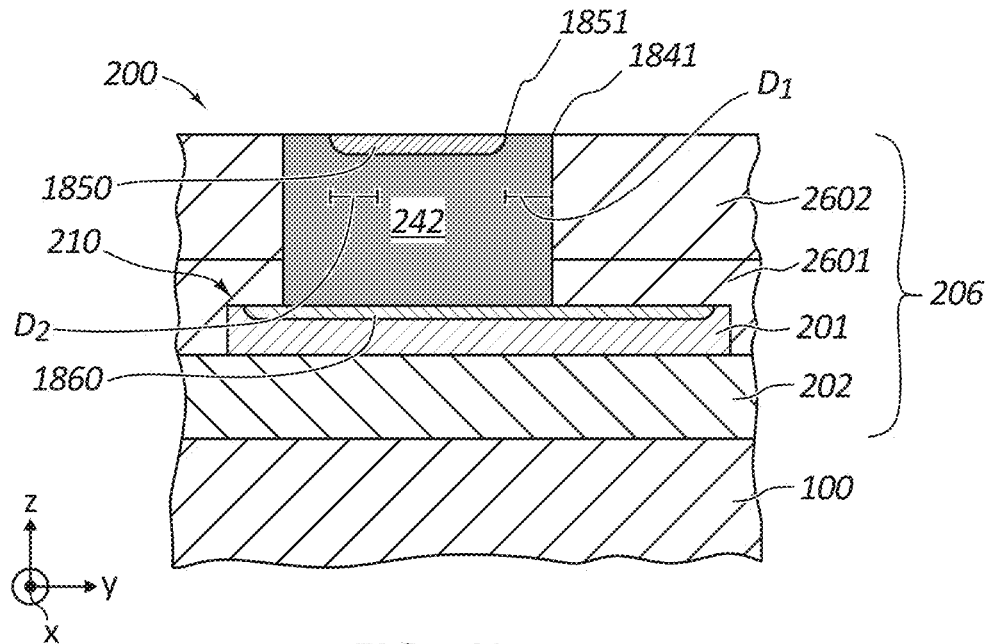

Referring again to the method for photodetector photonics device fabrication processing which can be performed subsequent to growing of germanium. FIG. 1I illustrates the photonics structure of FIG. 1H after planarizing of germanium. An overfill portion of germanium can be removed and planarized so that a top elevation of photosensitive material formation 242 provided by a germanium formation can be in common with a top elevation of layer 2602 which can be a capping layer. A chemical mechanical planarization (CMP) process can be used for performance of planarization. A CMP process can be used that selectively removes Ge with insignificant erosion of layer 2601 which can be formed of oxide. An overgrown germanium formation can exhibit a mushroom like structure as shown in FIG. 1H with well-defined facets and sharp corners and crests. For removal of such features, a CMP planarization process can include using a modified slurry (hydroxide based) and a first soft pad followed by the use of second hard (or standard) pad.

Figure 1J:
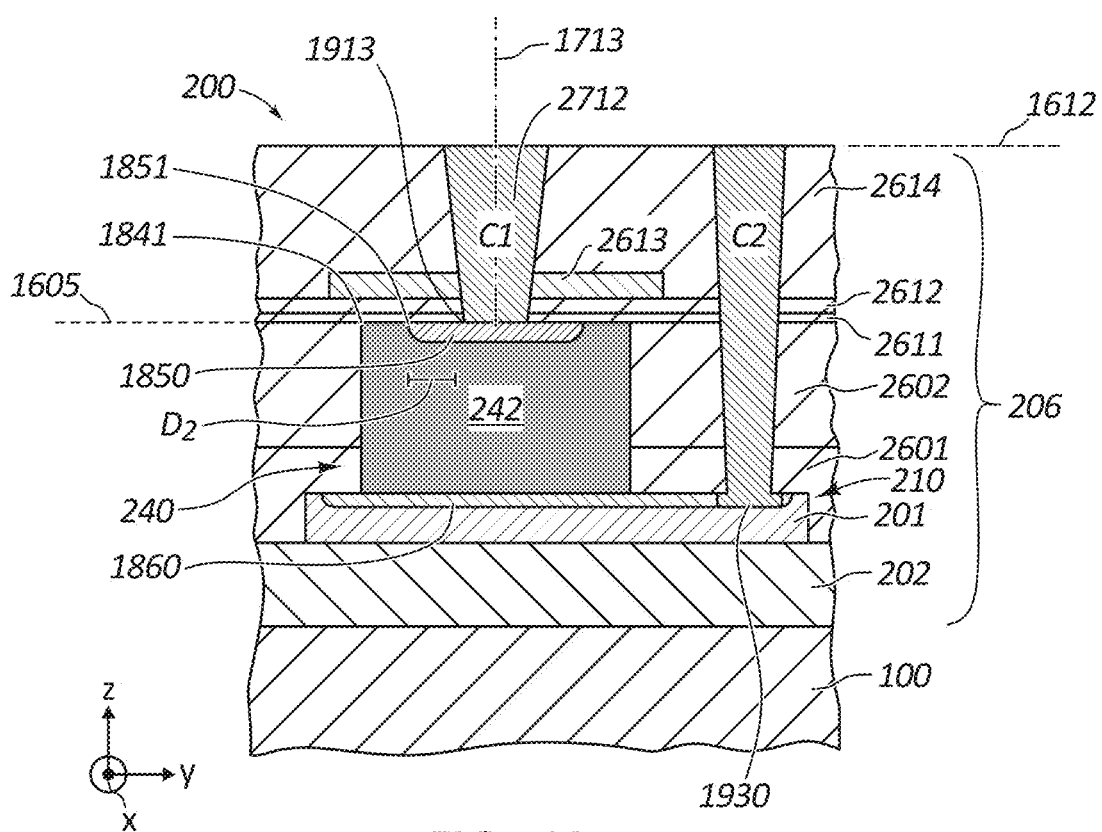

Subsequent to planarizing using a CMP planarization process, the photonics structure 200 as depicted in FIG. 1I can be subject to further processing to complete fabrication of a photodetector 240. FIG. 1J illustrates the photonics structure 200 of FIG. 1I after formation of top contact ion implantation region 1850, depositing of a layer 2611, layer 2612, layer 2613, and layer 2614 (as described in connection with FIGS. 1A-1F) formed of dielectric material e.g. oxide over layer 2602, and patterning and filling of a trench 1712 (FIG. 1B) shown occupied by conductive material formation C1 with a conductive material formation C1. Dielectric stack 206 can include layer 2601 which can be a cladding layer, layer 2602 which can be a capping layer, and layers 2611-2614.

Further in reference to FIG. 1J a bottom contact ion implantation region 1860 can be formed in waveguide 210 of layer 201 prior to the construction of dielectric trench 1810 defined in dielectric stack 206. In an alternative embodiment, a bottom contact ion implantation region 1860 can alternatively be formed in photosensitive material formation 242. In an alternative embodiment, a bottom contact ion implantation region 1860 can alternatively be formed partially in waveguide 210 and partially in photosensitive material formation 242. Formation of ion implantation region 1850 and ion implantation region 1860 in photosensitive material formation 242 or in a structure adjacent to photosensitive material formation 242 as set forth herein defines a p-i-n photodetector structure (p region at bottom) or n-i-p photodetector structure (n region at bottom).

In one aspect, a location of ion implantation region 1850 can be restricted to a reduced area of photosensitive material formation 242. Ion implantation region 1850 in one embodiment can be defined within a perimeter 1851. In one aspect, ion implantation region 1850 can be formed to have a trench to ion implantation region spacing distance $D_1$ equal to or greater than a threshold distance, $L_1$. Spacing distance $D_1$ can be the distance between perimeter 1851 of ion implantation region 1850 and the perimeter 1841 of photosensitive material formation 242 (in contact with dielectric stack 206 which can be formed of oxide). Because perimeter 1841 of photosensitive material formation 242 can be in contact with dielectric stack 206 that can define trench 1810, the spacing distance $D_1$ can also be the distance between perimeter 1851 of ion implantation region 1850 and trench 1810. In one embodiment, spacing distance $D_1$ can be substantially uniform throughout a top area of photosensitive material formation 242 and can be in a direction extending normally to perimeter 1851 of ion implantation region 1850 and perimeter 1841 of photosensitive material formation 242. In such embodiment, the spacing distance $D_1$ can be equal to or greater than the noted threshold distance throughout an entirety of perimeter 1851 of ion implantation region 1850 and the entirety of perimeter 1841 of photosensitive material formation 242. In one embodiment $L_1$ is 100 nm; in another embodiment 200 nm; in another embodiment 300 nm; in another embodiment 400 nm, in another embodiment 500 nm; in another embodiment 600 nm; in another embodiment 700 nm; in another embodiment 800 nm; in another embodiment 900 nm; in another embodiment 1.0 nm. A spacing distance $D_1$ can be designed based on, e.g., dimensional widening of features during processing, minimum printable feature dimensions, and reliable maximum feature printing misalignment.

A silicon photonics structure and process is set forth herein where the germanium photodetector structure may contain a reduced area top ion implantation region 1850 of the opposite polarity compared to the bottom ion implantation region 1860. By forming ion implantation region 1850 to have a trench to implantation spacing distance of $D_1$ an incidence of leakage current paths can be reduced. Reverse leakage current densities of less than about 1 nanoamperes per square micrometer can be achieved in one embodiment using top ion implantation region 1850 spaced to a trench to implantation region spacing distance $D_1$ of equal to or greater than a threshold distance $L_1$ of 0.75 µm from the oxide trench (at perimeter 1851) on each edge. Doses and energies can be tailored for producing a shallow ohmic contact to the conductor contact provided by contact conductive material formation C1, and a thin implant screening oxide can be employed to avoid Ge sputter removal. In one embodiment, ion implantation region 1850 can be formed to define a shallow top ion implantation.

Further referring to FIG. 1J, trench 1712 (FIG. 1B-1D) having vertically extending center axis 1713 is shown occupied by conductive material formation C1. Trench 1712 having vertically extending center axis 1713 can be formed in layers 2611-2614 as set forth in reference to FIGS. 1B-1D. Subsequently to formation of such trench 1712, a conductive material formation C1 can be formed in the trench 1712 shown occupied by conductive material formation C1. For patterning of the trench shown occupied by conductive material formation C1, layer 2614 can be formed of hard mask material. Layer 2614 in one embodiment can serve to enhance dry etching performance and furnish a stopping layer in a subsequent conductor polishing process. Conductive material formation C1 can be formed of semiconductor-compatible metallization material that is reflective to wavelengths in the range of from about 900 nm to about 1600 nm. Conductive material formation C1 can be a germanide-free (refractory) conductive material formation. In one aspect, trench 1712 shown occupied by conductive material formation C1 can be patterned so that conductive material formation C1 has a perimeter 1913 that is spaced apart from a perimeter 1851 of ion implantation region 1850.

Referring to FIG. 1J, spacing distance $D_2$ can be the distance between perimeter 1913 of contact formation C1 and perimeter 1851 of ion implantation region 1850. In one embodiment, the spacing distance $D_2$ can be equal to or greater than a threshold distance $L_2$. In one embodiment, spacing distance $D_2$ can be substantially uniform throughout an area of ion implantation region 1850 and can be in a direction extending normally to perimeter 1913 of contact formation C1 and perimeter 1851 of ion implantation region 1850. In such embodiment, the spacing distance D2 can be equal to or greater than the noted threshold distance throughout an entirety of perimeter 1913 of conductive material formation C1 and the entirety of perimeter 1851 of ion implantation region 1850. In one embodiment $L_2$ is 100 nm; in another embodiment 200 nm; in another embodiment 300 nm; in another embodiment 400 nm, in another embodiment 500 nm; in another embodiment 600 nm; in another embodiment 700 nm; in another embodiment 800 nm; in another embodiment 900 nm; in another embodiment 1.0 µm. Forming conductive material formation C1 to be spaced from a perimeter 1851 of ion implantation region 1850 assures that conductive material formation C1 can be fully contained within an area of ion implantation region 1850. There is set forth herein a silicon photonics structure and process wherein a germanium photodetector structure may include a reduced area top metal conductive material formation C1 that is fully contained in an area of top ion implantation region 1850. A spacing distance $D_2$ can be designed based on, e.g., dimensional widening of features during processing, minimum printable feature dimensions, and reliable maximum feature printing misalignment.

Prior to formation of conductive material formation C1, trench 1712 shown occupied by conductive material formation C1 can be subject to various processes so that conductive material formation C1 can be substantially free of metal germanide phases (such as nickel germanide). Ion implantation region 1850 allows for a reduced resistance connection to a germanide-free metal top contact formed of conductive material formation C1. In one embodiment, bottom ion implantation region 1860 can be formed in waveguide 210 defined by layer 201 formed of silicon.

Referring to FIG. 1J, a method of fabrication of photonics structure 200 having a silicide contact interface is set forth herein. The photonics structure 200 pertains to an intermediate step of fabrication after formation of the trench shown occupied by conductive material formation C2. Trench 1712 shown occupied by conductive material formation C2 can be formed in dielectric stack 206 which can be formed of dielectric e.g. oxide material. After formation of the trench shown occupied by conductive material formation C2, a silicide formation 1930 can be formed at a bottom of such trench, and then conductive material formation C2 can be formed in such trench.

In another aspect, photonics structure 200 can include a silicide formation 1930. For formation of silicide formation 1930, a metal, e.g., nickel (Ni) or nickel platinum (NiPt) layer can be sputtered into the trench shown as being occupied by conductive material formation C2 and subsequently annealed during a silicide formation stage so that the formed metal reacts with silicon of layer 201 to form silicide formation 1930 which can define a silicide contact interface. Silicide formation 1930 can be formed, e.g. of nickel silicide (NiSi) or nickel platinum silicide. In areas of photonics structure 200 other than at an interface to layer 201 formed of silicon, e.g., at sidewall defining the trench shown as being occupied by conductive material formation C2 and at a top of formation, the deposited metal can remain unreacted. Prior to annealing in one embodiment, a thin capping layer (not shown, e.g., formed of titanium nitride (TiN) can be formed over the formed nickel or nickel platinum. The thin capping layer can protect processing tools which might be negatively affected by metal evaporation. Unreacted metal (e.g., Ni, NiPt) and the thin capping layer can then be removed in an appropriate wet chemical solution. Photonics structure 200 can then be subject to further annealing in a transformation stage to transform silicide formation 1930 into a low resistivity phase. The transformation stage annealing can be performed at a higher temperature than the silicide formation annealing. In one embodiment, transformation stage annealing can be performed at a temperature of between about 300 degrees Celsius and about 550 degrees Celsius. In one embodiment, the silicide formation stage annealing can be performed at a temperature of between about 350 degrees Celsius and about 500 degrees Celsius.

It was observed that challenges to the formation of silicide formation 1930 as shown in FIG. 1J can be imposed by the configuration of the trench shown as being occupied by conductive material formation C2. In some embodiments wherein the trench shown as being occupied by conductive material formation C2 includes a narrow width, e.g. less than about 400 nm, it was observed that formed metal, e.g. Ni, NiPt may form preferentially on a top surface of photonics structure 200 in the intermediary fabrication stage shown or sidewall of the trench shown as being occupied by conductive material formation C2 relative to a bottom of trench at an interface to layer 201 which can be formed of silicon. In one embodiment, the trench shown as being occupied by conductive material formation C2 can include a depth of greater than about 1.3 µm and the width of greater than about 350 nm. To address such challenges, formed metal formed in the trench shown as being occupied by conductive material formation C2 for the formation of silicide can be overfilled within the trench shown as being occupied by conductive material formation C2 to assure that an appropriate volume of metal is formed at an interface to layer 201 which can be formed of silicon. In one embodiment, wherein the trench shown as being occupied by conductive material formation C2 includes depth of greater than about 1.3 µm and a width of greater than about 350 nm, of formed metal, e.g., Ni or NiPt can be deposited, e.g., via sputtering, to a depth of four times (4×) a desired depth at a bottom of the trench shown as being occupied by conductive material formation C2. In one embodiment, a formed metal can be deposited to a thickness of about 40 nm at a top of photonics structure 200 as shown in the intermediary fabrication stage of FIG. 1J to yield a thickness of about 10 nm at a bottom of the trench shown as being occupied by conductive material formation C2.

Referring to the intermediary fabrication stage view of FIG. 1J, the depositing of conductive material within the trench shown occupied by conductive material formation C2, can be performed in the manner of the depositing of material within trench 1712 (FIGS. 1B-1D) to define conductive material formation C1. That is, as shown in FIG. 1E, conductive material 2712 defining conductive material formation C1 can be deposited to overfill the trench 1712 shown occupied by conductive material formation C2 and then can be subject to CMP planarization to reduce an elevation of the conductive material formation to elevation 1612 and so that a top surface of photonics structure 200 is defined by conductive material formation C2 and layer 2614. The planarization can be performed using CMP planarization so that a top surface of photonics structure 200 depicted in FIG. 1J is planar and extends horizontally at elevation 1612 depicted in FIG. 1J running parallel to the X, Y plane of the depicted reference coordinate system. CMP planarization can be accompanied by CMP polishing so that a top surface of photonics structure 200 at elevation 1612 is atomically smooth.

In one embodiment, the depositing of conductive material defining conductive material formations C1 and C2 can be performed in a single depositing step. In another embodiment, first and second steps can be utilized. For example, the trench shown occupied by conductive material formation C1 can be filled prior to formation of the trench shown occupied by conductive material formation C2, then photonics structure 200 can be subject to patterning for formation of the trench shown occupied by conductive material formation C2, and then that trench shown occupied by conductive material formation C2 can be filled.

Photodetector 240 having waveguide 210 can have associated top and bottom contacts defined by contact conductive material formations C1 and C2, respectively and in one embodiment can feature a coordination of materials between conductive materials defining the respective conductive material formation C1 and C2. In Table A there are set forth various material properties of conductive materials that can be used to define the respective contacts C1 and C2 of photodetector 240. Table A is set forth herein below.

embodiment, conductive material 2712 (FIG. 1E) can be selected to be aluminum so that defined conductive material formation C1 of FIG. 1J is formed of aluminum. Providing conductive material formation C1 to be formed of aluminum can result in improved performance of photodetector 240. For example, light interacting with photosensitive material formation 242 can be expected to be reflected by conductive material formation C1, rather than absorbed, thus improving the signal to noise ratio of photodetector 240.

Conductive material formation C2, continuing with reference to FIG. 1J, like conductive material formation C1 in one embodiment can be selected to be aluminum (Al). Such an embodiment where conductive material formation C1 and conductive material formation C2 are each selected to be formed of aluminum can provide various advantages. For example, aluminum can feature excellent reflectance properties. By reason e.g. of its resistance to corrosion by oxidization, aluminum can feature improved reflectance characteristics relative to copper. Also, while corrosion and migration of copper can be inhibited with use of a barrier material such as SiCN, SiCN is light absorbing which can reduce reflectance of copper surfaces. Use of aluminum as conductive material formation C1 and/or C2 can result in an improved signal to noise ratio of photodetector 240. For example, light propagating through waveguide 210 as shown in FIG. 1J, for detection by photodetector 240 can be reflected by conductive material formation C1 and/or con-

TABLE A

| Material | Resistivity at 20° C. | Reflectance (at 1550 nm) | Optical Transmittance | Absorption Coefficient | Migration and/or Corrosion Characteristics |
|---|---|---|---|---|---|
| Copper (Cu) | $1.7 \times 10^{-8}$ Ohm-m | R = 0.93577 $R_p$ = 0.86366 | T = 1.4276e−33 | $\alpha$ = 8.6385e + 5 cm$^{-1}$ | Can migrate into e.g. silicon, germanium and oxide; Can corrode via oxidization |
| Aluminum (Al) | $2.8^2 \times 10^{-8}$ Ohm-m | R = 0.91999 $R_p$ = 0.84191 | T = 8.5848e−52 | $\alpha$ = 1.3065e + 6 cm$^{-1}$ | Can migrate into e.g. silicon, germanium and oxide but less migratory than copper; Resistant to corrosion via oxidization |
| Tungsten (W) | $5.6 \times 10^{-8}$ Ohm-m | R = 0.74083 $R_p$ = 0.50771 | T = 4.9813e−16 | $\alpha$ = 3.9151e + 5 cm$^{-1}$ | Stable (non-migratory) |

Copper (Cu) can feature low resistivity but can pose various challenges, e.g. it can migrate into silicon and oxide. Further, copper can be susceptible to corrosion via oxidization to increase the resistivity of copper. Aluminum (Al) has higher resistivity than copper but can feature improved absorptivity characteristics. Tungsten (W) can feature higher resistivity than either copper or aluminum but can be resistant to migration. Tungsten can be expected to be stable and not migrate into adjacent surfaces formed, e.g. of silicon or oxide. In Table A, R refers to reflectance for non-polarized light, and Rp refers to reflectance for polarized light.

Embodiments herein recognize in reference to FIG. 1J that material selection for use in defining conductive material formation C1 and respectively conductive material formation C2 can be coordinated in various ways. In one ductive material formation C2 rather than absorbed (as may occur in the case of oxidized copper or copper in combination with a light absorbing barrier material).

In some embodiments, performance of photodetector 240 can be improved by selection of conductive material formation C2 to be of material different than conductive material formation C1. In some embodiments for example, the presence of absorptive material defining conductive material formation C2 can pose reduced risk to the light detecting functions of photodetector 240, e.g. where conductive material formation C2 is spaced a longer spacing distance relative to photosensitive material formation 242. In such an embodiment, conductive material formation C2 can be selected to be formed of copper (Cu) rather than aluminum and thus, such an embodiment where conductive material formation C1 is formed of aluminum and conductive material formation C2 is formed of copper can feature both excellent optimized optical performance by the reflective properties of conductive material formation C1 as well as improved electrical properties provided by the low resistivity of conductive material formation C2, which can yield faster electrical signal propagation speed. Embodiments herein recognize that while copper can feature lower resistivity and higher signal propagation speed, use of copper can potentially inhibit performance of photodetector 240, e.g. where due to design constraints such as sizing and material related design constraints, an interface of conductive material formation C2 to layer 201 can feature high contact resistance, attributable to e.g. migration of copper into layer 201 or corrosion of copper.

Accordingly, in one embodiment for improved performance of photodetector 240, conductive material formation C1 can be selected to be provided by aluminum and conductive material formation C2 can be selected to be provided by tungsten (W). Such an embodiment can feature reduced contact resistance between conductive material formation C2 and layer 201 formed of silicon attributable to the excellent migration properties of tungsten. For improving reflectance of conductive material formation C1 and conductive material formation C2, the respective surfaces on which conductive material formation C1 and conductive material formation C2 can be formed to be atomically smooth. With the patterning of layer 201 formed of silicon to define waveguide 201 as shown in FIG. 1G-1J, a top surface of layer 201 patterned to define waveguide 210 can be subject to CMP planarization so that the top surface of waveguide 210 is planar and extends in a horizontal plane extending in parallel with the reference X-Y horizontal plane. Subsequent to subjecting the top surface of waveguide 210 to CMP planarization, the top surface of waveguide 210 can be subject to CMP polishing so that the top surface of waveguide 210 is atomically smooth Making the top surface of waveguide 210 atomically smooth can increase a reflectance of conductive material formation C1 and conductive material formation C2 deposited on the top surface of waveguide 210.

Figure 2A:
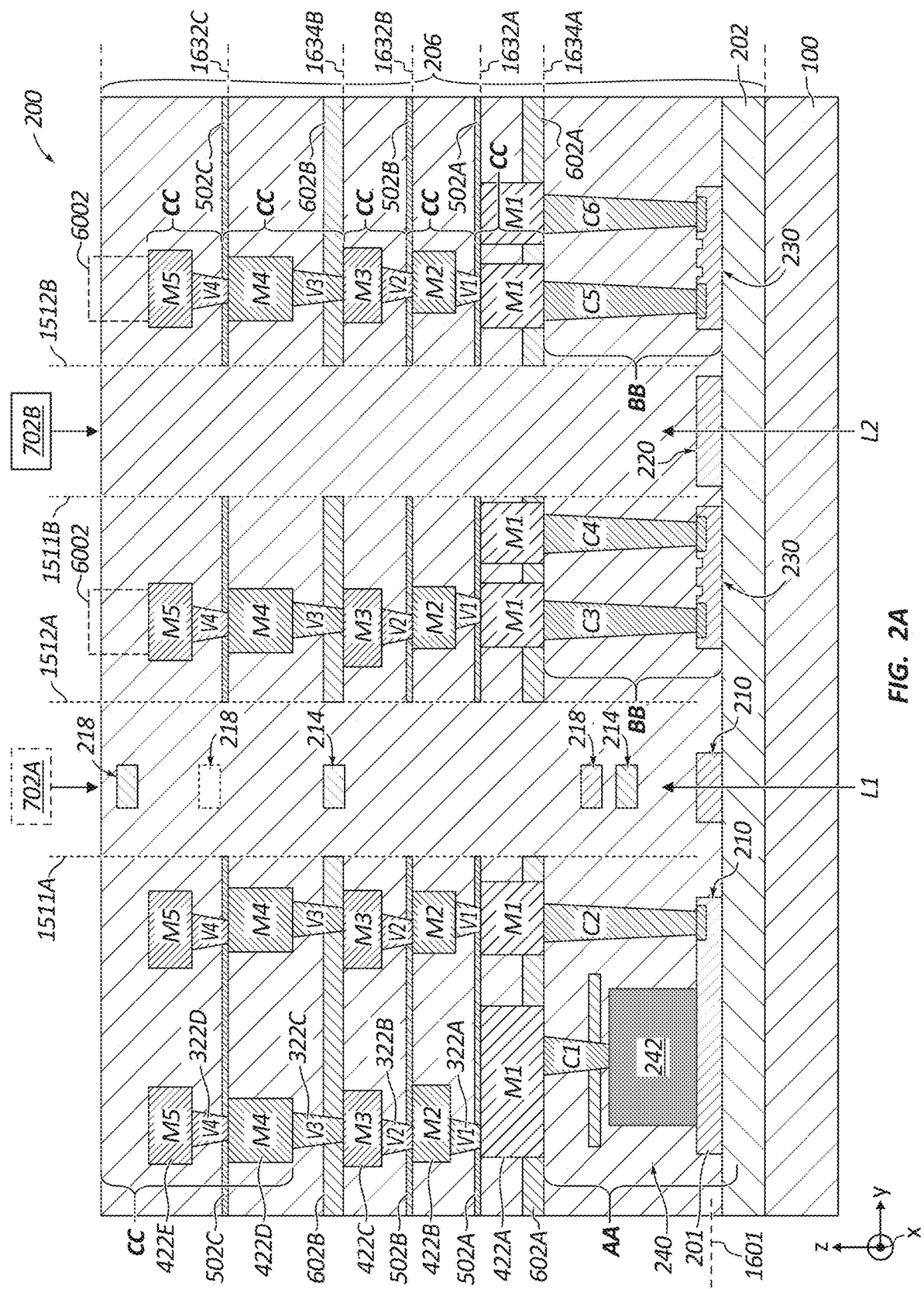
FIG. 2A is a cutaway side view of a photonics structure having a plurality of photonics devices according to one embodiment.

FIG. 2A illustrates fabrication of photonics structure 200 having a dielectric stack 206 in a subsequent stage of fabrication which there can be fabricated and defined one or more photonics device such as one or more waveguide of waveguides 210, one or more waveguide of waveguides 214, one or more waveguide 218, one or more grating 220, one or more modulator 230, and one or more photodetector 240 as described in connection with FIGS. 1A-1J.

A one or more photonics device can in addition or alternatively be provided e.g. by a resonator, a polarizer or another type of photonics device. In the described embodiment, waveguides 210 can represent waveguides formed of single crystalline silicon (Si), waveguides 214 can represent waveguides formed of nitride, e.g. SiN, and waveguides 218 can represent waveguides formed of any generic waveguiding material, e.g. single crystalline silicon, polycrystalline silicon, amorphous silicon, silicon nitride, or silicon oxynitride. Photonics structure 200 can be built using a prefabricated silicon on insulator (SOI) wafer having substrate 100, layer 202 provided by an insulator layer and layer 201 provided by a silicon layer. Waveguides 210, grating 220 and modulator 230 can be patterned in layer 201 provided by a silicon layer of the SOI wafer.

Patterned within dielectric stack 206 there can also be contact conductive material formations such as contact conductive material formations C1, C2, C3, C4, C5 and C6, metallization layer 422A defining metallization layer formations M1, metallization layer 422B defining metallization layer formation M2, metallization layer 422C defining metallization layer formations M3, metallization layer 422D defining metallization layer formations M4, and metallization layer 422E defining metallization layer formations M5.

Metallization layer 422A, metallization layer 422B, metallization layer 422C, metallization layer 422D, and metallization layer 422E can define horizontally extending wires. Wires defined by metallization layers 422A, 422B, 422C, 422D, 422E can be horizontally extending through areas of dielectric stack 206. Metallization layers 422A, 422B, 422C, 422D, 422E can be formed generally by depositing one or more dielectric stack layer to at least top elevation of the respective metallization layer 422A, 422B, 422C, 422D, 422E etching to define cavities for receiving conductive material, filling the cavities with conductive material, and then planarizing to the top elevation of the respective metallization layer 422A, 422B, 422C, 422D, 422E. Metallization layers 422A, 422B, 422C, 422D, 422E can also be formed generally by depositing uniform thickness metallization layers, and then masking and etching to remove layer material from unwanted areas. Metallization layers 422A, 422B, 422C, 422D, 422E can be formed from metal or other conductive material.

Horizontally extending wires defined by metallization layer 422A can be electrically connected to one or more vertically extending contact formations C1-C6 and vias V1 defined by vias layer 322A for distribution of one or more of control, logic and/or power signals vertically and horizontally to different areas of dielectric stack 206 having fabricated therein one or more photonics device.

Horizontally extending wires defined by metallization layer 422B can be electrically connected to one or more of vertically extending vias V1 defined by vias layer 322A and/or vertically extending vias V2 defined by vias layer 322B for distribution of one or more of electrical control, logic and/or power signals vertically and horizontally between different areas of dielectric stack 206.

Horizontally extending wires defined by metallization layer 422C can be electrically connected to one or more of vertically extending vias V2 defined by vias layer 322B and/or vertically extending vias V3 defined by vias layer 322C for distribution of one or more of electrical control, logic and/or power signals vertically and horizontally between different areas of dielectric stack 206.

Horizontally extending wires defined by metallization layer 422D can be electrically connected to one or more of vertically extending vias V3 defined by vias layer 322C and/or vertically extending vias V4 defined by vias layer 322D for distribution of one or more of electrical control, logic and/or power signals vertically and horizontally between different areas of dielectric stack 206.

Horizontally extending wires defined by metallization layer 422E can be electrically connected to one or more of vertically extending vias V4 defined by vias layer 322D for distribution of one or more of electrical control, logic and/or power signals vertically and horizontally between different areas of dielectric stack 206.

Vias layers 322A, 322B, 322C, and/or 322D can be formed by depositing on one or more dielectric stack layer to at least a top elevation of the respective vias layer 322A, 322B, 322C, and/or 322D, etching to define cavities with conductive material, and then planarizing to a top elevation of the respective vias layer 322A, 322B, 322C, and/or 322D.

Figure 2B:
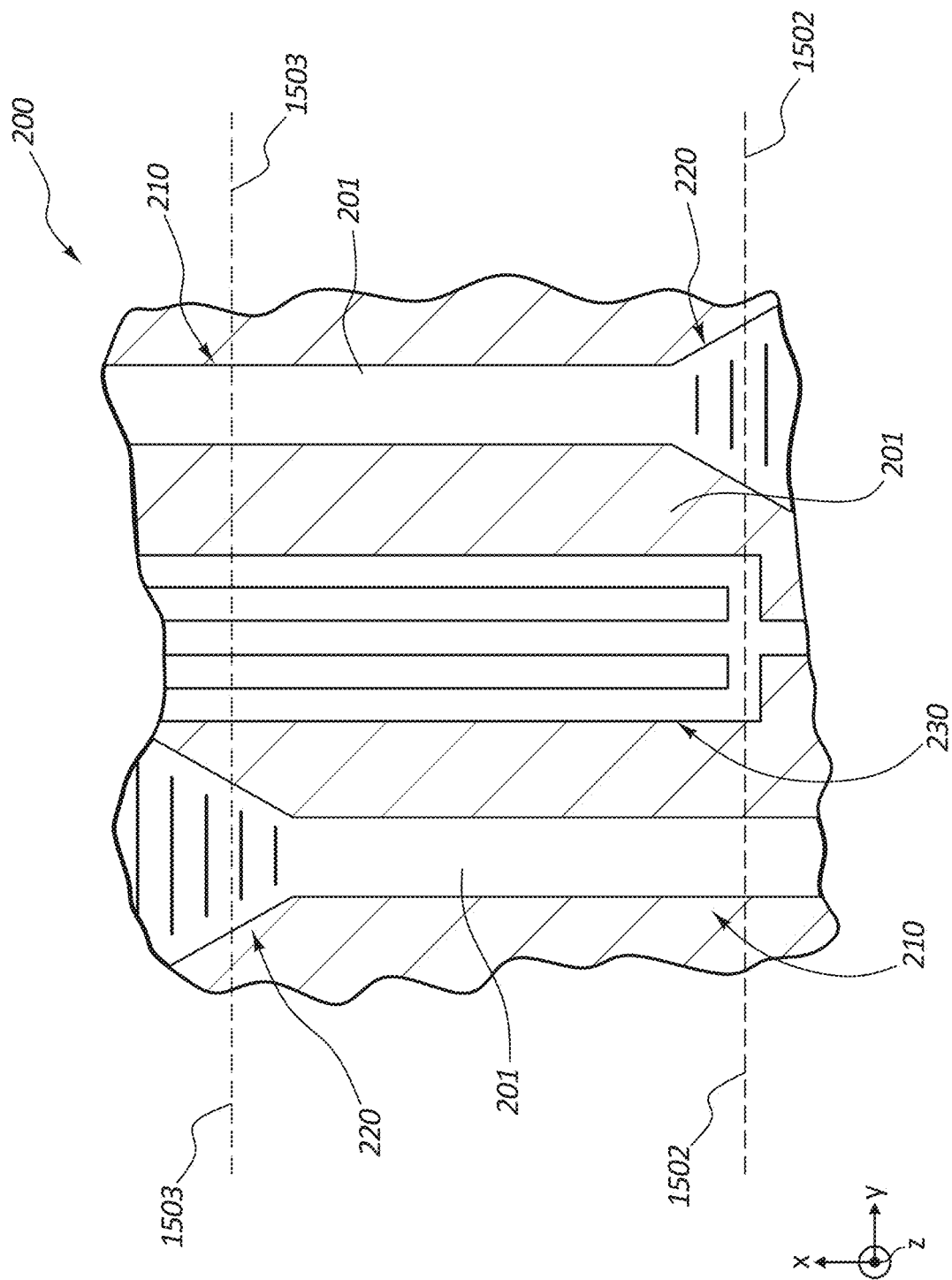
FIG. 2B is a cutaway top view of the photonics structure of FIG. 2A taken along elevation 1601 of FIG. 2A according to one embodiment.

A patterned top cross-sectional view of photonics structure 200 taken along elevation 1601 of FIG. 2A is shown in FIG. 2B. Photonics structure 200 can have fabricated in dielectric stack 206 various photonics devices, e.g. waveguide 210, 214, 218, grating 220, modulator 230, or photodetector 240. In the view of FIG. 2B, waveguides 210, grating 220, and modulator 230 are shown.

Embodiments herein recognize that use of copper formations defining conductors in photonics structure 200 can increase performance of photonics structure 200 based on the low resistance properties of copper (Cu). Copper can include resistivity of about $1.72 \times 10^{-8}$ ohms-m at 20° C. Thus, use of copper can significantly increase signal propagation speed. Embodiments herein recognize problems with use of copper, however, including copper migration and corrosion of copper. Copper can migrate into material of a dielectric stack for example. Copper can also readily oxidize and corrode resulting in increased resistivity. Dielectric layers of dielectric stack 206 that are deposited on metallization layers can be selected to function as a barrier to resist migration of conductive material, and to inhibit corrosion attributable to oxidization. In one embodiment SiCN can be selected to Emu a barrier to resist migration of copper and to inhibit corrosion by oxidization of copper. SiCN has electrical migration and corrosion barrier properties. While migration of copper can be resisted with use of SiCN, embodiments herein recognize that SiCN can exhibit significant light absorption particularly in the IR band.

Embodiments herein further recognize that SiCN can inhibit performance of a photonics system. For example, embodiments herein recognize that where there is a designed light signal transmission path in a photonics system, a presence of SiCN can absorb light energy and accordingly can inhibit (e.g. reduce or prevent performance of) transmission of a light signal.

Referring to FIG. 2A, photonics structure 200 can include one or more designed light signal transmission region. For example, there can be a light signal transmission region L1 at the X dimension cross sectional depth shown in FIG. 2A (depth 1502 shown in FIG. 2B) depicted in FIG. 2B between vertically extending planes 1511A and 1512A. There can be a light signal transmission region L2 at X dimension cross sectional depth shown in FIG. 2A (depth 1502 shown in FIG. 2B) between vertically extending planes 1511B and 1512B. In each light signal transmission region L1 and L2 a light signal can be transmitted from a higher elevation to a lower elevation and/or from a lower elevation to a higher elevation. Light signal transmission region L1 and light signal transmission region L2 can transmit light signals of photonics structure 200 e.g. upwardly or downwardly, and in one embodiment can transmit light signals vertically (about 90-degree angle with respect to a horizontal plane). Light signal transmission regions of photonics structure can transmit light signals in any direction.

Light signal transmission within light signal transmission region L1 can include light signal transmissions between photonics devices at different elevations, e.g. between two or more waveguides within light signal transmission region L1 at the respective elevations 1632A, 1632B, 1632C, 1634A, 1634B depicted in FIG. 2A.

Photonics structure 200 can be configured so that first and second waveguides of waveguides 210, 214, 218 couple light signals therebetween, or alternatively are in optical isolation from one another and do not couple light signals. Coupling between waveguides can be controlled by controlling spacing between waveguides and additional parameters, e.g. controlling spacing so that intended light signal coupling between waveguides occurs or controlling spacing so that waveguides are in optical isolation. Light signal coupling between waveguides can include e.g. evanescent coupling or tap coupling.

Light signal transmission region L1 can include an associated light input device 702A shown in dashed in form in FIG. 2A. Light input device 702A can be provided e.g. by a laser light source or a fiber optic cable carrying light. Light signal transmission within light signal transmission region L2 can include light signal transmissions between light input device 702B and a photonics device provided by grating 220 shown in FIG. 2A. Light input device 702B can be provided e.g. by a laser light source or a fiber optic cable carrying light that emits light downwardly through light signal transmission region L2. Photonics device defined by grating 220 depicted in FIG. 2A can be provided e.g. by a photonics grating that receives signal light emitted by light input device 702B. Photonics structure 200 can have associated light input devices 702A and 702B associated to photonics structure 200 for inputting light generally downwardly e.g. vertically or about vertically. Photonics structure 200 can additionally or alternatively have associated light input devices (e.g. laser light sources or light carrying cables) that input light into photonics structure 200 generally laterally e.g. horizontally or about horizontally.

A top view cross sectional view of FIG. 2A taken along FIG. 2A elevation 1601 is shown in FIG. 2B. In FIG. 2B depth 1502 can illustrate the cut depth of the cross-sectional Z-Y plane cross sectional view shown in FIG. 2A and depth 1503 (FIG. 2B) can illustrate a depth into the paper with respect to the view of FIG. 2A. Light input device 702B can couple light downwardly to the photonics device defined by grating 220 depicted in FIG. 2A e.g. provided by a photonics grating at about X dimension depth 1502 (the cut depicted in FIG. 2A). Light input device 702A depicted in dashed form in FIG. 2A can couple light downwardly to photonics device provided by a photonics grating 220 at about the X dimension depth 1503 (FIG. 2B). Photonics device defined by grating 220 at depth 1503 (FIG. 2B) can be integrally formed with a forwardly extending waveguide as shown (extending out of the paper in FIG. 2A) and photonics device defined by grating 220 at depth 1502 (FIG. 2B) can be integrally formed with a waveguide 210 extending into the paper with respect to the cut depth depicted in FIG. 2A.

Embodiments herein recognize that the presence of light absorbing materials in the light signal transmission region L1 between vertically extending plane 1511A and vertically extending plane 1512A and the light signal transmission region L2 between vertically extending plane 1511B and vertically extending plane 1512B can negatively impact operation of photonics structure 200.

Embodiments herein recognize e.g. that a presence of SiCN within light signal transmission region L1 can inhibit light signal transmission for coupling between depicted photonics structures fabricated within dielectric stack 206 within light signal transmission region L1. Embodiments herein recognize e.g. that a presence of SiCN within light signal transmission region L2 can inhibit light signal transmission between depicted light input device 702B and photonics device defined by grating 220 fabricated within dielectric stack 206 within light signal transmission region L2. Embodiments herein recognize that waveguides have transmission modes wherein light signals propagating through a waveguide travel partially externally to an external wall of the waveguide. Such waveguide external light can undesirably be absorbed by formations of SiCN.

Photonics structure 200 in one embodiment can be fabricated using various processes including processes for fabricating conductive pathways. Processes for fabrication of photonics structure 200 can include (A) fabrication of one or more contact conductive material formation of a photodetector, (B) a process for fabrication of one or more conductive material for formation of a modulator, and (C) a process for fabrication of conductive material layers including termination metallization layer of photonics structure 200. Process (A) has been described with reference to FIGS. 1A-1J showing photodetector 240 depicted in area (AA) of FIG. 2A. Process (B) of fabricating one or more conductive material for formation of a modulator is described with reference to FIGS. 3A-3D showing a modulator, e.g., as shown in area (BB) of FIG. 2A. Process (C) of fabrication of conductive material layers including termination metallization layer of photonics structure 200 is described with reference to FIGS. 4A-4Z showing metallization layers including a termination metallization layer e.g. as described in connection with area (CC) of FIG. 2A.

Figure 3A:
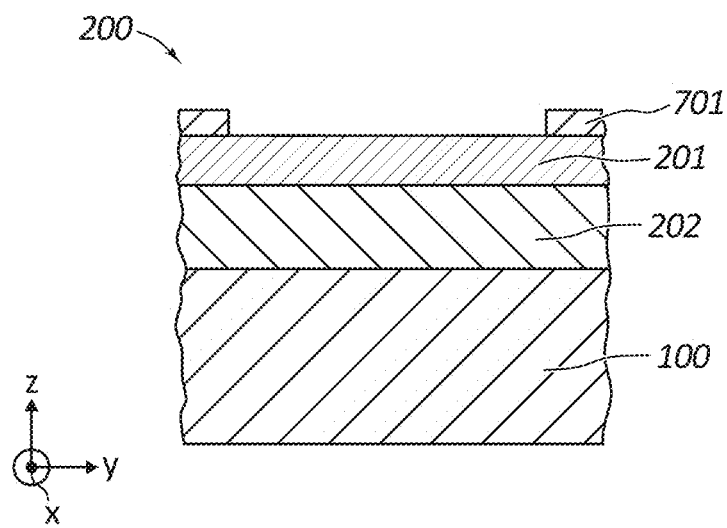
FIGS. 3A-3D are fabrication stage views illustrating fabrication of a modulator in a photonics structure according to one embodiment.

FIG. 3A illustrates photonics structure 200 in an intermediary stage of fabrication, wherein the silicon-on-insulator (SOI) wafer is subjected for patterning for fabrication of a modulator. As shown in FIG. 3A, an SOI wafer can include a substrate 100, layer 202 provided by an insulator, and layer 201 provided by a silicon layer. In FIG. 3A there is depicted photoresist layer 701 for use in initial patterning of a modulator. Layer 701 provided by a resist layer can include a pattern to define a modulator as set forth in the ensuing views of FIGS. 3C-3D. The photolithography stack depicted in FIG. 3A is depicted as a single layer photolithography stack. In one embodiment, a multilayer photolithography stack, e.g. a multilayer organic photolithography stack can be used.

Figure 3B:
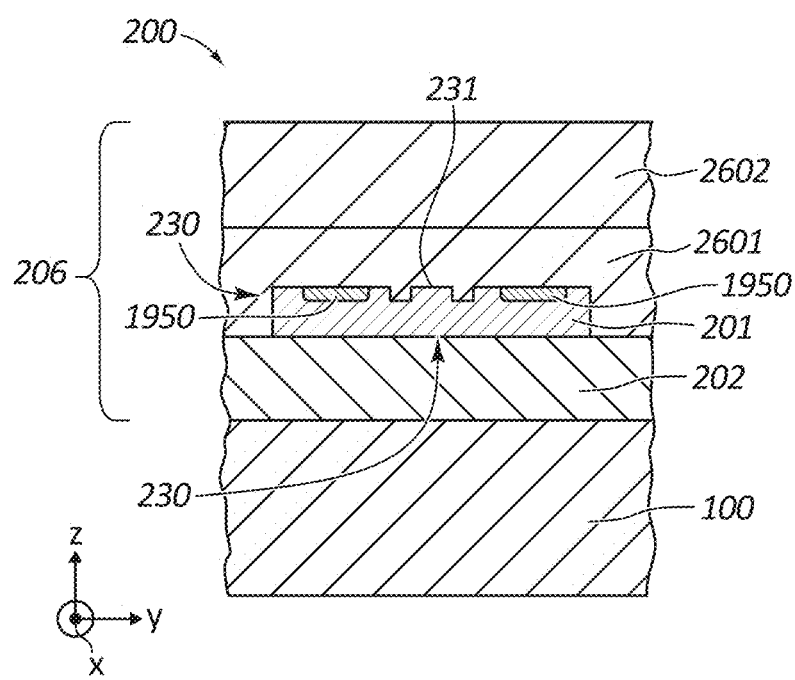

FIG. 3B illustrates photonics structure 200 as shown in FIG. 3A in an intermediary stage of fabrication subsequent to additional patterning and fabrication processes. As shown in FIG. 3B modulator 230 can be defined by patterning of layer 201 provided by a silicon layer using the photolithography stack depicted in FIG. 3A as well as one or more additional photolithography stack and additional patterning steps to define center ridge 231 of modulator 230.

Figure 3C:
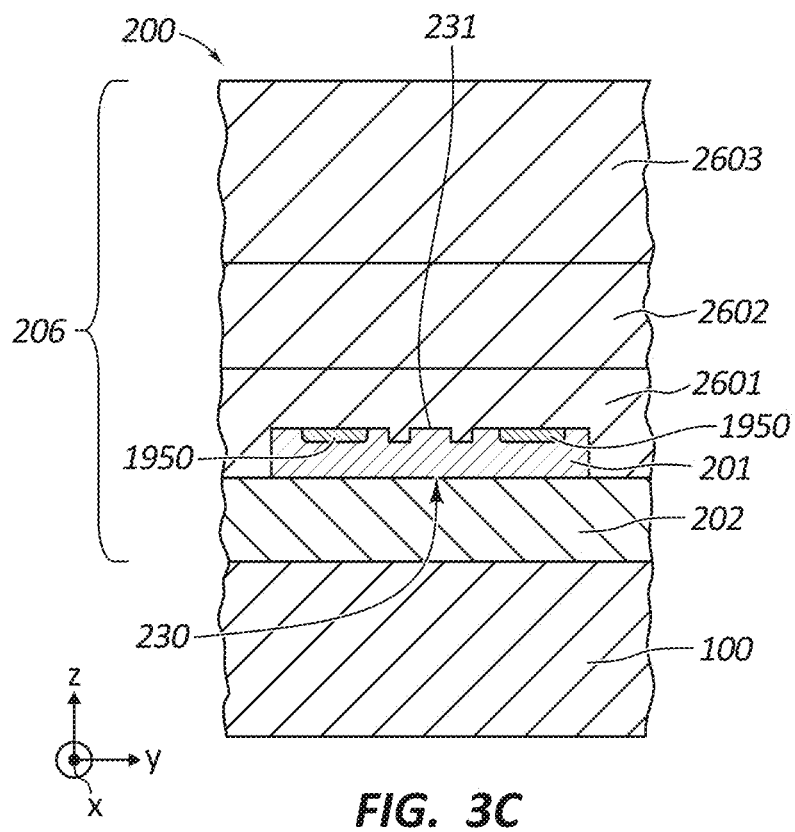

Subsequent to patterning to define modulator 230, photonics structure 200 as depicted in FIG. 3C can be subject to further processing to deposit layer 2601 provided by a dielectric layer, e.g. oxide such as silicon dioxide and depositing layer 2602 on layer 2601. Layer 2601 can be deposited on and about modulator 230 on patterning of layer 201 to define modulator 230. Prior to the depositing of layer 2602, ion implantation can be performed to define ion implantation regions 1950 of modulator 230. Depositing of layer 2601 and layer 2602 can include use of plasma enhanced chemical vapor deposition (PECVD) process temperatures permitted by the thermal budget for use in fabrication of photonics structure 200.

On the depositing of layer 2601, layer 2601 can be planarized to reduce an elevation of layer and to define a top planar surface extending in a horizontal plane parallel to an X-Y plane of the depicted reference coordinate system. The planarizing can include use of CMP planarization. The CMP planarization can be accompanied by CMP polishing so that a top surface of layer 2601 is atomically smooth. Likewise, on depositing layer 2602, layer 2602 can be subject to planarization by CMP planarization to reduce an elevation of layer 2602 accompanied by CMP polishing so that a top surface of layer 2602 is atomically smooth.

FIG. 3B illustrates photonics structure 200 as depicted in FIG. 3A in an intermediary stage of fabrication subsequent to depositing of layer 2601 formed of dielectric material, e.g. $SiO_2$ and layer 2602. A PECVD process can be used for deposition of layer 2601 at a reduced thermal temperature budget, e.g. using a temperature in the range of about 300° C. to about 500° C. In one embodiment, depositing of layer 2602 can include depositing non-conformal material on and about defined modulator 230 patterned as described in connection with FIG. 3B and other photonics devices patterned in layer 201 including waveguide 210 defining photodetector 240, waveguide 210, grating 220 and second modulator 230 (FIG. 2A).

Depositing of layer 2601 can include use of PECVD with high aspect ratio processing (HARP). Non-conformality may be achieved using plasma enhancements during a deposition phase with conditions tuned to enhance deposition rates on horizontal surfaces while suppressing deposition rates on vertical surfaces (e.g. on step edges defined with use of a Bosch process). Thus, voids and other defects resulting from pinch off of a cladding layer can be avoided and detrimental effects of the same on light signal transmission can be minimized. In one embodiment, layer 2601 can be formed of non-conformal oxide material, e.g. non-conformal Sift. Use of non-conformal oxide material for layer 2601 can reduce incidents of voids and other defects in dielectric stack 206 that surrounds modulator 230 and other photonics devices patterned in layer 201 including waveguide 210 defining photodetector 240, waveguide 210, grating 220 and second modulator 230 (FIG. 2A).

A non-conformal oxide material can be a material that is adapted to a deposit at a higher rate, on horizontal surfaces while exhibiting a suppressed sidewall deposition rate. In one embodiment, of a method for providing non-conformal oxide material a deposition of oxide material can be plasma enhanced. It can be envisioned (but is not depicted) that with the use of conformal material for use of layer 2601 pinch off can occur when layer 2601 is deposited on and about high aspect ratio features and accordingly can result in an introduction of voids with oxide surrounding modulator 230 and other photonics devices patterned in layer 201 including waveguide 210 defining photodetector 240, waveguide 210, grating 220 and second modulator 230 (FIG. 2A).

In one embodiment, for improved gap filling, depositing of layer 2601 can include depositing of high density plasma (HDP) oxide. In one embodiment, layer 2601 can be formed of silane based HDP oxide. Layer 2601 formed of silane based HDP oxide can be deposited using silane based high density plasma chemical vapor deposition (HDPCVD). Embodiments herein recognize that silane based HDP oxide can reduce incidents of voids and other defects in dielectric stack 206 that surrounds modulator 230 and other photonics devices patterned in layer 201 including waveguide 210 defining photodetector 240, waveguide 210, grating 220 and second modulator 230 (FIG. 2A).

FIG. 3B illustrates photonics structure 200 as depicted in FIG. 3A subsequent to further processing of layer 2601 formed of a cladding dielectric material e.g. oxide such as $SiO_2$ to define a cladding layer. Referring to FIG. 3B a top surface of layer 2601 can be subject to CMP planarization to reduce an elevation of layer 2601 and to provide processing so that a top surface of layer 2601 is planar and extends in a horizontal plane to provide processing planarity for subsequent layers. CMP planarization can be accompanied by CMP polishing so that a top surface of layer 2601 is atomically smooth.

FIG. 3B further illustrates photonics structure 200 in an intermediary stage of fabrication subsequent to depositing of layer 2602. Layer 2602 can be provided by capping dielectric material e.g. oxide such as $SiO_2$ or tetraethoxysilane (TEOS). Depositing of layer 2602 can include use of silane based PECVD at a reduced thermal budget, e.g. at a temperature of between about 300° C. and about 500° C. Layer 2633 can be regarded as a capping layer.

FIG. 3B illustrates photonics structure 200 as depicted in FIG. 4M in an intermediary stage of fabrication subsequent to further processing of layer 2602. Further processing of layer 2602 depicted in FIG. 3B can include subjecting layer 2602 to CMP planarization to reduce an elevation of layer 2602 and to provide a top surface of layer 2602 so that a top surface of layer 2602 is planar and extends in a horizontal plane. CMP planarization of layer 2602 can be accompanied by CMP polishing so that a top surface of layer 2602 is atomically smooth.

The depositing planarizing and polishing of layer 2601 and the depositing planarizing and polishing of layer 2602 can provide elevation control. Elevation control can provide optical coupling between a photonics device patterned in layer 201 (such as modulator 230, waveguide 210 defining photodetector 240, waveguide 210, grating 220 or second modulator 230 (FIG. 2A)) and a photonics device at an elevation higher than layer 201 where optical coupling is targeted. Elevation control can provide optical isolation between a photonics device patterned in layer 201 (such as modulator 230, waveguide 210 defining photodetector 240, waveguide 210, grating 220 or second modulator 230 (FIG. 2A)) and a photonics device at an elevation higher than layer 201 where optical isolation is targeted.

Figure 3D:
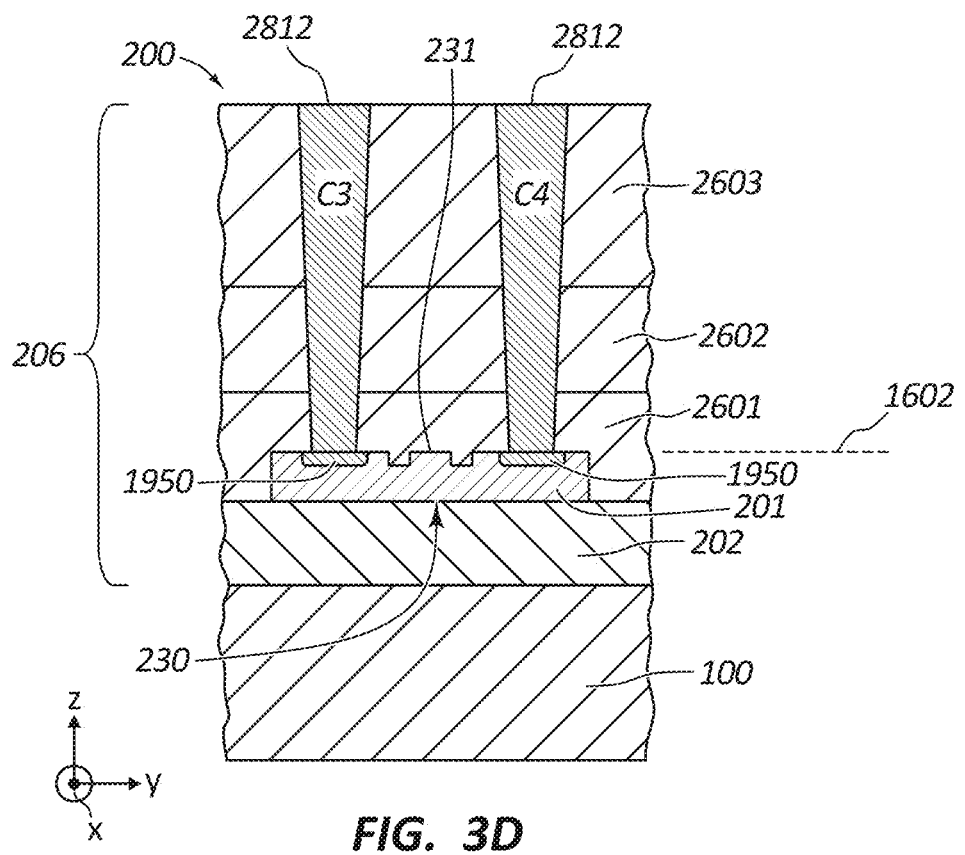

FIG. 3D depicts photonics structure 200 as depicted in FIG. 3C in an intermediary stage of fabrication after further processing steps to define trenches shown as being occupied by conductive material 2812 and then depositing of conductive material 2812 into the defined trenches. The define trenches extend downwardly into dielectric stack 206 to elevation 1602 which is the elevation of a top surface of modulator 230.

Deposition of conductive material 2812 can include use of physical vapor deposition (PVD). With use of PVD a material being deposited transitions from a condensed phase to a vapor phase and then back to a thin film condensed phase. A PVD process can include sputtering and evaporation. Deposition of conductive material 2812 can be performed so that conductive material 2812 covers an entire top surface of a wafer on which photonics structure 200 is fabricated. Photonics structure 200 can be fabricated using a silicon on insulator (SOI) wafer having a substrate 100, layer 202 provided by an insulator layer, and layer 201 provided by a silicon layer as set forth herein further in reference to FIG. 2A.

FIG. 3D illustrates photonics structure 200 after planarization of photonics structure 200. Planarization depicted in the intermediary fabrication stage view of FIG. 3D can include CMP planarization to reduce an elevation of photonics structure 200 to the top elevation as depicted in the stage view of FIG. 3D. Planarization as depicted in FIG. 3D can be performed so that a top surface of photonics structure 200 as depicted in the intermediary stage view of FIG. 3D is partially defined by conductive material 2812 and partially defined by layer 2603 as planarized and extends in a horizontal plane parallel to the X-Y plane of the depicted referenced coordinate system. CMP planarization can be accompanied by CMP polishing so that a top surface of photonics structure 200 in the intermediary stage view depicted in FIG. 3D partially defined by conductive material 2812 and partially defined by layer 2603 is atomically smooth.

Referring again to Table A, illustrating various properties of various conductive materials such as copper (Cu), aluminum (Al), and tungsten (W). Material selections for contact conductive material formation C3 and contact conductive material formation C4 can include various alternative embodiments, each of which can improve the functioning of modulator 230 and photonics structure 200 depending on process and design parameters of photonics structure 200.

In one embodiment for example, both contact C3 and contact C4 can be selected to be provided by copper. In such an embodiment, electrical signal propagation speed can be improved based on the low resistivity of copper. In one embodiment of modulator 230 as depicted in FIG. 3D, light signal propagation through modulator 230 can be through ridge 231 of modulator 230. Embodiments herein recognize that where ridge 231 is relatively closely spaced to ion implantation regions 1950 which receive electrical domain, electrical signals through contact C3 and C4 respectively, contact C3 and C4 may undesirably absorb modulator transmission signal light, thus deleteriously impacting performance of modulator 230. For improved performance where ridge 231 is closely spaced to ion implantation regions 1950, contact conductive material formation C3 and C4 can be selected to be provided by aluminum. As set forth herein, aluminum, based on its reflectivity properties can reflect rather than absorb transmitted signal light being modulated and thus, selection of aluminum for contact C3 and C4 can improve performance of modulator 230.

Embodiments herein recognize that according to some designs, modulator 230 can be susceptible to high contact resistances between ion implantation regions 1950 and their respective contact conductive material formations C3 and C3. For example, sizing design constraints and/or material design constraints can increase the risk that contact resistance can negatively impact performance of modulator 230. In such embodiments contact conductive material formations C3 and C4 can be provided by tungsten. As set forth herein, tungsten can feature excellent resistance to migration, and therefore, reduced contact resistance.

Referring to areas CC of FIG. 2A and FIGS. 4A-4Z aspects of (C) a process for fabrication of a metallization layer which in one embodiment can include a termination metallization layer as set forth herein.

Referring to FIGS. 4A-4Z, there are shown a series of fabrication stage views illustrating fabrication of areas CC of photonics structure 200, depicted in FIG. 1. FIG. 4A illustrates photonics structure 200 in an intermediary stage of fabrication after depositing of layer 502 formed of SiCN providing a barrier layer. As shown in the stage view depicted in FIG. 4A, depositing of SiCN can include depositing a portion of layer 502 on a top surface of dielectric stack 206 and depositing a portion of layer 502 on one or more section of layer 422, which layer 422 can be formed of copper (Cu). The portion of layer 502 deposited on dielectric stack 206 can extend through a light signal transmission region defined between vertically extending plane 1511 and vertically extending plane 1512.

Figure 4Q:
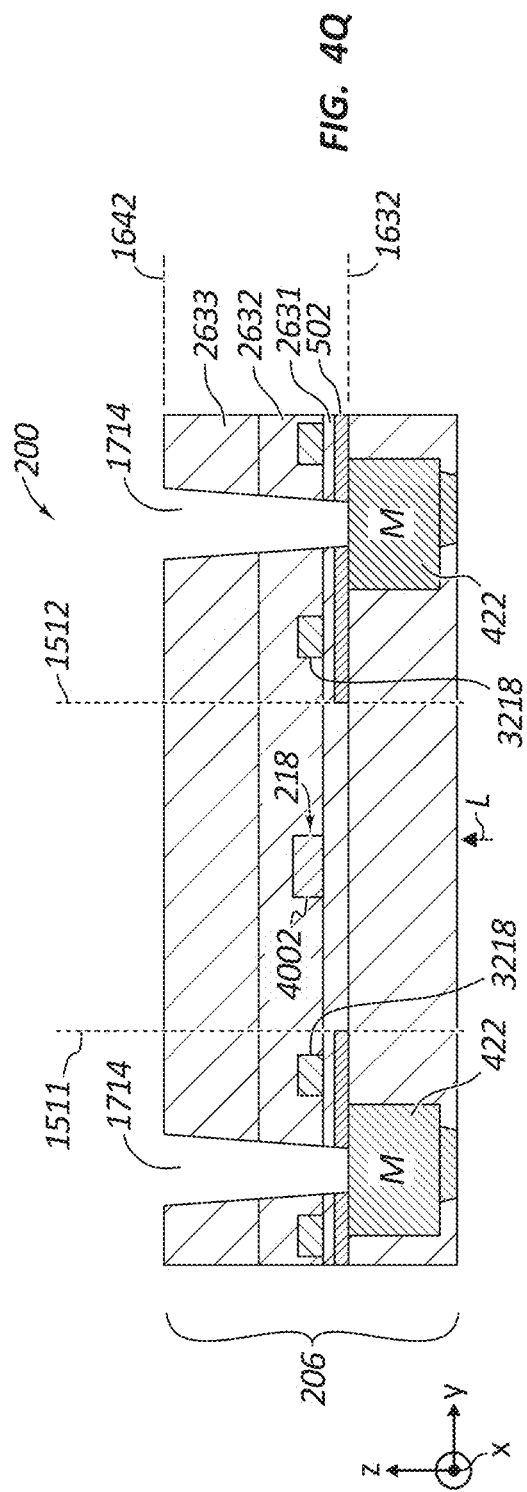
FIGS. 4A-4Z are fabrication stage views illustrating fabrication of a vias layer and a metallization layer of a photonics structure according to one embodiment.
Figure 4R:
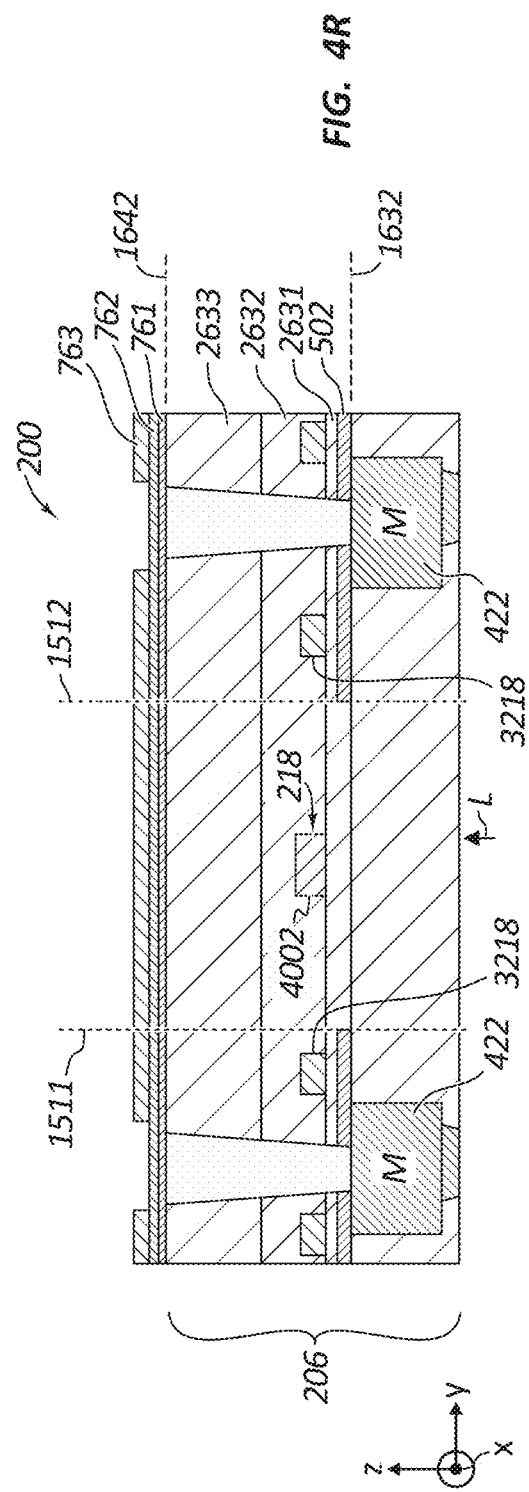
Figure 4U:
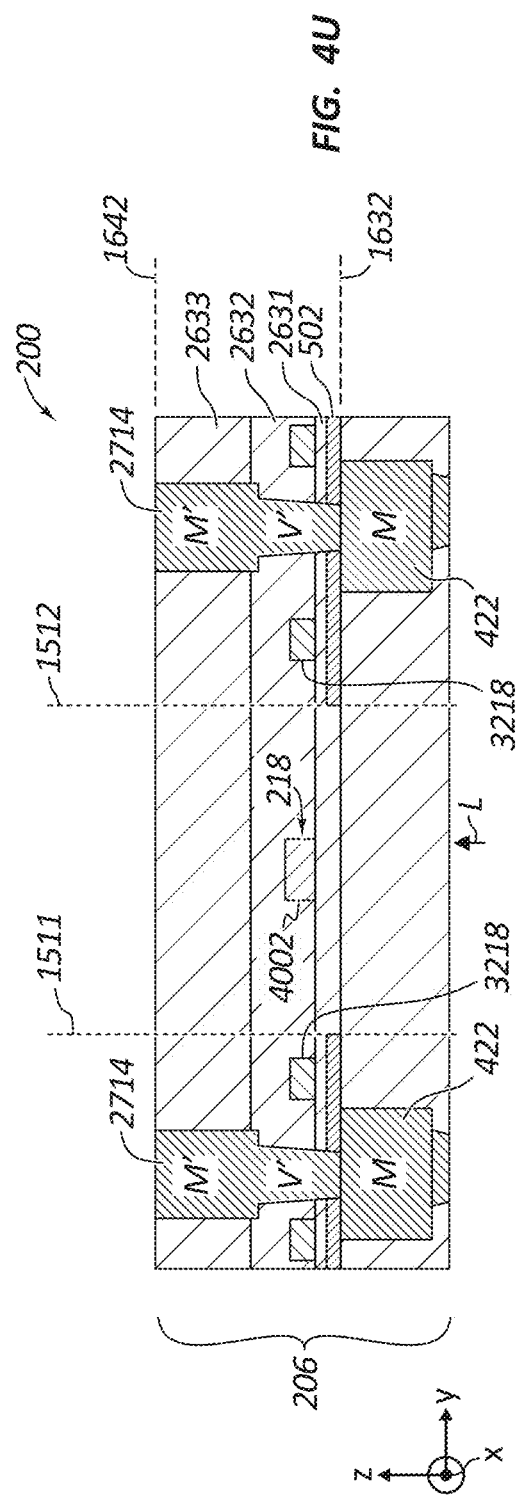
Figure 4V:
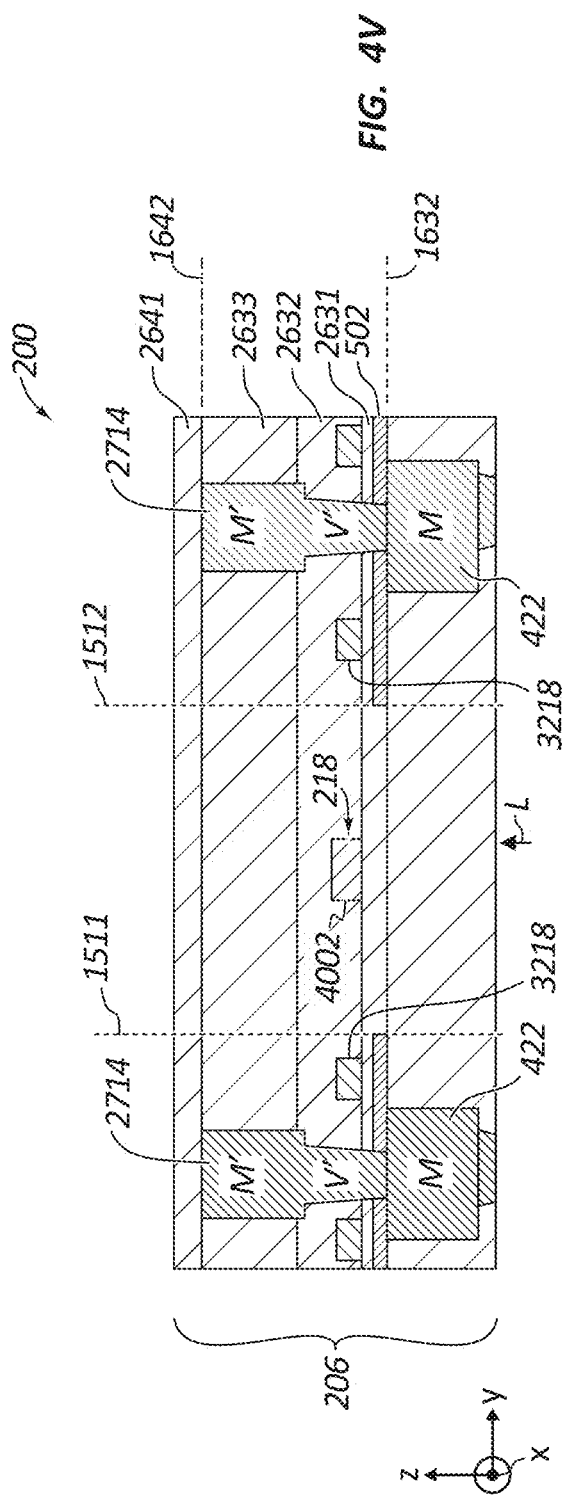
Figure 4W:
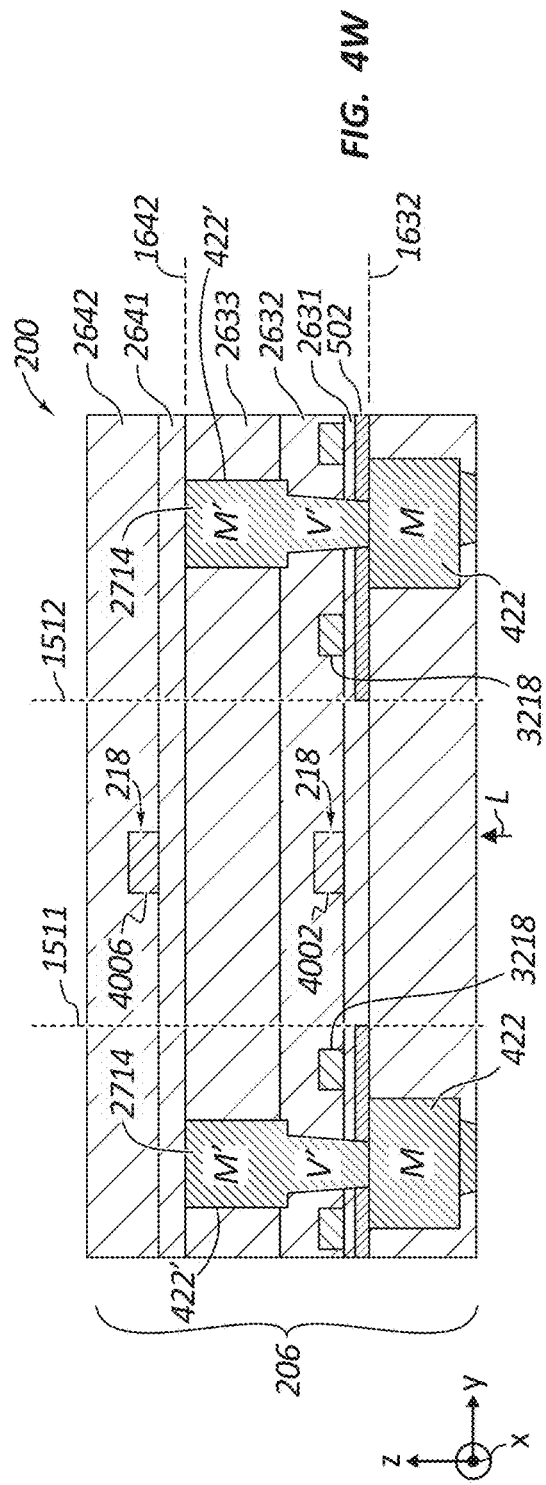

In the stage views depicted in FIGS. 4A-4W, layer 502 generically represents any of layers 502A-502C, depicted in FIG. 2A, layer 422 generically represents any of layers 422A-422B, or 422D (the termination metallization layer) of FIG. 2A, pairs of vertically extending planes 1511 and 1512 generically represents any of pairs of vertically extending planes 1511A and 1512A, or vertically extending planes 1511B and 1512B of FIG. 2A, metallization layer formation M generically represents any of metallization layer formations M1, M2, or M4 (the termination metallization layer formations) depicted in FIG. 2A, and light signal transmission region L generically represents any of light signal transmission regions L1 or L2 depicted in FIG. 2A.

Prior to the depositing of layer 502 formed of SiCN, the photonics structure 200 depicted in the stage view of FIG. 4A can be subject to CMP planarization to reduce an elevation of photonics structure 200 to elevation 1632, representative generically of any of the elevations 1632A-1632C depicted in FIG. 2A. The performance of CMP planarization to reduce an elevation of photonics structure 200 to elevation 1632 can be accompanied by CMP polishing to polish photonics structure 200 at elevation 1632. CMP planarization can result in photonics structure 200 defining planar horizontal surface at elevation 1632 prior to deposition of layer 502 formed of silicon carbon nitride (SiCN) so that deposition of layer 502 can include deposition of layer 502 on a planar surface.

CMP polishing can result in photonics structure 200 featuring an atomically smooth surface at elevation 1632 prior to the deposition of layer 502. Providing the surface of photonics structure 200 to be atomically smooth at elevation 1632 can facilitate performance of light signal transmission region L, e.g. by the reduction of unwanted light scattering.

For depositing of layer 502 formed of SiCN partially on metallization layer formation M, plasma enhanced chemical vapor deposition (PECVD) can be employed. PECVD can be performed with use of reduced thermal budget, e.g. in a temperature range of from about 300° C. to about 500° C.

Still referring to the stage view of FIG. 4A, layer 502 on completion of depositing of layer 502 can exhibit a roughened top surface as depicted in the stage view of FIG. 4A.

FIG. 4B illustrates photonics structure 200 as depicted in the stage view of FIG. 4A after subjecting a top surface of layer 502 to processing for smoothing of a top surface of layer 502. Photonics structure 200 as depicted in the intermediary stage view of FIG. 4B can be subject to CMP planarization to planarize the top surface of layer 502 to reduce an elevation of layer 502 so that the top surface of layer 502 is planar and extends in a horizontal plane. The CMP planarization can be accompanied by CMP polishing so that the top surface of layer 502 depicted in the intermediary stage view of FIG. 4B is an atomically smooth surface.

FIG. 4C is an intermediary fabrication stage view of photonics structure 200 as depicted in the stage view of FIG. 4B after depositing of a photolithography stack for use in etching of layer 502 in light signal transmission region L between vertically extending plane 1511 and vertically extending plane 1512.

The photolithography stack depicted in the intermediary fabrication stage view of FIG. 4C can be an organic photolithography stack. The photolithography stack depicted in the intermediary fabrication stage view of FIG. 4C can be a multilayer organic photolithography stack and can include layers 731, 732, and 733. Layer 731 can be an organic planarization layer (OPL), layer 732 can be a silicon-containing anti-reflective coating (SIARC) layer, and layer 733 can be a resist layer. Referring to the intermediary fabrication stage view of FIG. 4C, the intermediary fabrication stage view of FIG. 4C depicts photonics structure 200 subsequent to patterning of layer 733 to define a pattern for etching away of a portion of layer 502 within light signal transmission region L.

Patterning of layer 733 can be performed with use of a photolithography mask disposed in a photolithography tool (not shown) that is activated to expose areas of layer 733 not protected by the photolithography mask within the photolithography tool.

FIG. 4D illustrating photonics structure 200 as shown in FIG. 4C in an intermediary stage of fabrication after performance of etching using the pattern of layer 733 to remove material of layer 502 in light signal transmission region L between vertically extending plane 1511 and vertically extending plane 1512.

For performance of etching depicted in the intermediary fabrication stage view of FIG. 4C, reactive ion etching (RIE) can be used. RIE depicted in the intermediary stage view of FIG. 4D can include use of an etching process that is selective to oxide so that material of layer 502 provided by SiCN can be removed without removal of material of dielectric stack 206. On completion of RIE as depicted in the intermediary fabrication stage view of FIG. 4D, etching products 3102 can remain on photonics structure 200. Etching products 3102 can include, e.g. residual amounts of the photolithography stack including layers 731, 732, 733 and residual amounts of SiCN, which can be located on dielectric stack 206 depicted in light signal transmission region L as shown in the intermediary fabrication stage view of FIG. 4C.

FIG. 4E depicts photonics structure 200 as shown in FIG. 4D, in an intermediary stage of fabrication subsequent to cleaning to remove etching products 3102, depicted in FIG. 4D. Cleaning as depicted in FIG. 4E can include temperature controlled cleaning to avoid damage to surfaces of photonics structure 200 such as a top surface of dielectric stack 206. For cleaning of RIE products 3102 a mixture that can be used that includes ammonia hydroxide ($NH_4OH$) and peroxide ($H_2O_2$). Temperature controlled cleaning can include performing of cleaning at temperatures of about 25° C. or less.

FIG. 4F illustrates photonics structure 200 as depicted in FIG. 4E in an intermediary stage view of fabrication, subsequent to depositing of layer 2602 which can be formed of cladding dielectric material e.g. oxide such as silicon dioxide ($SiO_2$). As seen in the stage view depicted in FIG. 4F, layer 2602 may have multiple elevations, e.g. a lower elevation within the light signal transmission region L between vertically extending plane 1511 and vertically extending plane 1512 and a higher elevation to the left of vertically extending plane 1511 and to the right of vertically extending plane 1512. The differing elevations can result from the removal of portion of layer 502 in the stage depicted in FIG. 4C.

FIG. 4G illustrates photonics structure 200 as depicted in FIG. 4F in an intermediary stage of fabrication subsequent to further processing to planarize and polish layer 2602. Depicted in the intermediary fabrication stage view of FIG. 4G, layer 2602 which can be formed of cladding dielectric material e.g. oxide such as $SiO_2$ can be subject to CMP planarization to reduce an elevation of layer 2602 and to planarize layer 2602 so that a top surface of layer 2602 is planar and extends in a horizontal plane. The CMP planarization to planarize layer 2602 can be accompanied by CMP polishing to polish a top surface of layer 2602, so that a top surface of layer 2602 is atomically smooth.

Example conditions for the process (C) described in connection with FIGS. 4A-4G according to one embodiment are set forth in Table B.

TABLE B

| | |
|---|---|
| Layer thickness ranges of layers 502, 2631 | SiCN thickness range from about 20 nm to about 200 nm, pteos (SiO2) thickness oxide range is from about 50 nm to about 2,000 nm. |
| Deposition of layer 502 | Pressure enhanced chemical vapor deposition (PECVD) (temperature controlled, e.g. using temperatures of between about 300° C. and about 500° C.). |
| Patterning of Layer 502 | Resist over SIARC (43%) over OPL |
| Etching of layer 502 | Etch SiCN selective to oxide with key removal over photonics devices |
| Cleaning of layer 502 | Cleaning with NH4OH and H2O2 ratios tuned for cleaning efficiency that are under (<25° C. temps), cleaning residue, SiCN and oxide surface so oxide surface remains smooth and defect free for further oxide processing |
| Depositing of layer 2631 | Dielectric cladding provided by oxide for Z height control to locate any oxide to oxide interface away from an SiN waveguide. PECVD can be used, (temperature controlled, e.g. using temperatures of between about 300° C. and about 500° C.). |
| Planarizing and polishing of layer 2631 | Atomic level smoothness (<2A RMS) for improved fabrication of additional photonic devices e.g. formed of SiN or for oxide capping layers. |

Providing layer 2631 to be atomically smooth can facilitate light signal transmissions through layer 2631. Providing processing of layer 2631 so that a top surface of layer 2631 is planarized and atomically smooth can provide processing planarity for subsequent fabrication including for fabrication of photonics devices. In one embodiment, layer 2631 can support fabrication of a photonic device formed over layer 2631.

FIGS. 4H-4Q are fabrication stage views illustrating fabrication of a photonics device provided by a waveguide 218 over layer 2602. Referring again to FIG. 2A, there is illustrated waveguide 218 in dashed line form formed on a dielectric layer that is formed on layer 502C of SiCN, which layer 502 can be formed on metallization layer 422. However, it is understood that waveguide 218 shown in dashed form in FIG. 2A can additionally or alternatively be formed on respective dielectric layers formed on layer 502A and/or layer 502B.

FIG. 4H illustrates photonics structure 200 as depicted in FIG. 4G in an intermediary stage of fabrication after depositing of layer 4002, formed of waveguiding material. Waveguiding material defining layer 4002 can be provided, e.g. by single crystalline silicon, polycrystalline silicon, amorphous silicon, silicon nitride, or silicon oxynitride. Depositing of layer 4002 formed of waveguiding material can include use of PECVD at a reduced thermal budget, e.g. at a processing temperature of from about 300° C. to about 500° C. As depicted in the intermediary fabrication stage view of FIG. 4H, processing of layer 4002 can include depositing layer 4002 on layer 2631 and then subjecting layer 4002 to additional processing after deposition of layer 4002. The additional processing can include subjecting layer 4002 to CMP planarization to planarize layer 4002 to reduce an elevation of layer 4002 so that a top surface of layer 4002 is planar and extends in a horizontal plane. The subjecting of layer 4002 to CMP planarization can include subjecting layer 4002 to CMP polishing so that a top surface of layer 4002 is atomically smooth.

FIG. 4I illustrates photonics structure 200 as depicted in FIG. 4H in an intermediary stage of fabrication subsequent to forming of a photolithography stack on layer 4002 formed of waveguiding material. The photolithography stack depicted in FIG. 4I can include layer 741 formed of OPL, layer 742 formed of SIARC, and layer 743 formed of resist.

FIG. 4J illustrates photonics structure 200 as illustrated in FIG. 4I in an intermediary stage of fabrication subsequent to etching away of material of layer 4002 formed of waveguiding material using the pattern of photolithography stack depicted in FIG. 4I to define waveguide 218. Layer 4002 and accordingly waveguide 218 can be formed of any suitable waveguiding material, e.g. monocrystalline silicon, single crystalline silicon, polycrystalline silicon, amorphous silicon, silicon nitride, or silicon oxynitride. The pattern of photolithography stack of FIG. 4I can include the pattern of waveguide 218 as well as a pattern form defining dummy form shapes 3218 having the height of waveguide 218. Dummy form shapes 3218 can facilitate elevation control for the dielectric deposition depicted in FIG. 4K. Improved elevation control can improve optical coupling between waveguide 218 and a photonics device at an elevation higher that waveguide 218 where optical coupling is targeted. Improved elevation control can improve optical isolation between waveguide 218 and a photonics device at an elevation higher that waveguide 218 where optical isolation is targeted.

Respective dummy form shapes 3218 depicted in FIG. 4J adjacent to waveguide 218 can be spaced at a spacing distance within a range of spacing distances e.g., from about 2 nm to about 2000 nm from waveguide 218 according to one embodiment, and from about 50 nm to about 2000 nm from waveguide 218 according to one embodiment. Respective dummy form shapes 3218 depicted in FIG. 4J adjacent to a dummy form shape 3218 can be spaced at a spacing distance within a range of spacing distances, e.g., from about 2 nm to about 2000 nm from an adjacent dummy form shape according to one embodiment, and from about 50 nm to about 2000 nm from waveguide 218 according to one embodiment. Dummy form shapes 3218 can be patterned to have Y dimension widths of from about 2 nm to about 2000 nm. Dummy form shape 3218 can be patterned to be located at locations within dielectric stack 206 wherein the dummy form shapes 3218 are optically isolated from waveguide 218. Shown as being patterned in layer 4002 dummy form shapes 3218 can alternatively or additionally be patterned in another layer in which photonics devices are patterned, e.g. layer 201, and/or a layer from which any one of waveguides 214 and/or 218 are patterned (FIG. 1). Dummy form shapes 3218 can be configured to feature heights and material in common with one or more waveguide patterned from a waveguiding material layer from which the dummy form shapes 3218 are patterned, but dummy form shapes 3218 can be configured to absent of optical signal propagation functionality.

Regarding waveguide 218 shown in an intermediary stage of fabrication in FIG. 4J, waveguide 218 can include vertically extending sidewall 218W. Anisotropic etching can be used for the formation of vertically extending sidewall 218W. Etching to define waveguide 218 so that waveguide 218 features vertically extending sidewall 218W can improve coupling between waveguide 218 and photonics devices external to waveguide 218.

Vertically extending sidewall 218W can be fabricated in one embodiment using reactive ion etching (RIE). RIE can be performed or define vertically extending sidewall 218W. RIE can include a series of etching and depositing steps. RIE for etching of layer 4002 to define vertically extending sidewall 218W can include use of a Bosch type RIE, and in one embodiment an amount of material of layer 4002 can be removed according to an iterative etch step followed by an iterative deposit step. In each iterative deposit step, material can be deposited on a defined sidewall 218W. Deposited material deposited on sidewall 218W can include a polymer material. Following each iterative depositing step, there can be performed a further etching to etch away another amount of material of layer 4002 formed of waveguiding material.

Vertically extending sidewall 218W which can be formed, e.g. using a Bosch process can be subject to line edge roughness treatment. In the case where waveguide 218 is formed of nitride line edge roughness treatment can include application of a steam or high pressure oxidation at moderate to high temperatures to convert a few outermost nanometers of the silicon nitride (SiCN) defining waveguide 218 to form silicon dioxide ($SiO_2$). The formed $SiO_2$ can then be subject to removal by immersion in an aqueous hydrofluoric solution to remove the formed $SiO_2$ in order to improve line edge roughness of the defined waveguide 218. In the case waveguide 218 is formed of silicon line edge roughness treatments can include H2 annealing using reduced pressure chemical vapor deposition (RPCVD) or rapid thermal chemical vapor deposition (RTCVD) processing or depositing epitaxial silicon on the surfaces to reduce line edge roughness.

FIG. 4K illustrates photonics structure 200 as depicted in FIG. 4J in an intermediacy stage of fabrication subsequent to depositing of layer 2632 formed of dielectric material, e.g. $SiO_2$. A PECVD process can be used for deposition of layer 2632 at a reduced thermal temperature budget, e.g. using a temperature in the range of about 300° C. to about 500° C. In one embodiment, depositing of layer 2632 can include depositing non-conformal material on and about waveguide 218 patterned as described in connection with FIG. 4J.

Depositing of layer 2632 can include use of PECVD with high aspect ratio processing (HARP). Non-conformality may be achieved using plasma enhancements during a deposition phase with conditions tuned to enhance deposition rates on horizontal surfaces while suppressing deposition rates on vertical surfaces (e.g. on step edges defined with use of a Bosch process). Thus, voids and other defects resulting from pinch off of a cladding layer can be avoided and detrimental effects of the same on light signal transmission can be minimized. In one embodiment, layer 2632 can be formed of non-conformal oxide material, e.g. non-conformal $SiO_2$. Use of non-conformal oxide material for layer 2632 can reduce incidents of voids and other defects in dielectric stack 206 that surrounds waveguide 218.

A non-conformal oxide material can be a material that is adapted to a deposit at a higher rate, on horizontal surfaces while exhibiting a suppressed sidewall deposition rate. In one embodiment, of a method for providing non-conformal oxide material a deposition of oxide material can be plasma enhanced. It can be envisioned (but is not depicted) that with the use of conformal material for use of layer 2632 pinch off can occur when layer 2632 is deposited on and about high aspect ratio features and accordingly can result in an introduction of voids with oxide surrounding waveguides such as waveguides 218.

In another embodiment, for improved gap filling, depositing of layer 2632 can include depositing of high density plasma (HDP) oxide. In one embodiment, layer 2632 can be formed of silane based HDP oxide. Layer 2632 formed of silane based HDP oxide can be deposited using silane based high density plasma chemical vapor deposition (HDPCVD). Embodiments herein recognize that silane based HDP oxide can reduce incidents of voids and other defects in dielectric stack 206 that surrounds waveguide 218.

FIG. 4L illustrates photonics structure 200 as depicted in FIG. 4K, subsequent to further processing of layer 2632 formed of a cladding dielectric material e.g. oxide such as $SiO_2$ to define a cladding layer. Referring to FIG. 4L a top surface of layer 2632 can be subject to CMP planarization to reduce an elevation of layer 2632 and to provide processing so that a top surface of layer 2632 is planar and extends in a horizontal plane to provide processing planarity for subsequent layers. CMP planarization can be accompanied by CMP polishing so that a top surface of layer 2632 is atomically smooth.

FIG. 4M illustrates photonics structure 200 as depicted in FIG. 4L in an intermediary stage of fabrication subsequent to depositing of layer 2633 on layer 2632. Layer 2633 can be provided by capping dielectric material e.g. oxide such as $SiO_2$ or tetraethoxysilane (TEOS). Depositing of layer 2633 can include use of a silane based PECVD at a reduced thermal budget, e.g. at a temperature of between about 300° C. and about 500° C. Layer 2633 can be regarded as a capping layer.

FIG. 4N illustrates photonics structure 200 as depicted in FIG. 4M in an intermediary stage of fabrication subsequent to further processing of layer 2633. Further processing of layer 2633 depicted in FIG. 4N can include subjecting layer 2633 to CMP planarization to reduce an elevation of layer 2633 and to provide a top surface of layer 2633 so that a top surface of layer 2633 is planar and extends in a horizontal plane at elevation 1642. CMP planarization of layer 2633 can be accompanied by CMP polishing so that a top surface of layer 2633 is atomically smooth.

Embodiments herein can include use of differentiated and coordinated processes for the formation of dielectric stack 206. According to one example, a cladding layer such as layer 2601 (FIGS. 1J and 3B) or layer 2632 (FIG. 4k) surrounding a patterned photonics device can be formed for void reduction using a first process and a second process can be used for formation of a capping layer (layer 2602 of FIGS. 1J and 3B) and layer 2633 of FIG. 4M. According to one embodiment the first process can include e.g. silane based high density plasma chemical vapor deposition to provide silane based HDP oxide (or alternatively HARP). According to one embodiment the second process for the formation of a capping layer can include PECVD for the formation of TEOS.

According to one example, a first cladding layer such as layer 2601 (FIGS. 1J and 3B) surrounding a patterned photonics device can be formed for void reduction using a first process and a second process can be used for formation of a second cladding layer 2632 (FIG. 4k) surrounding a patterned photonics device. According to one embodiment the first process can include e.g. silane based high density plasma chemical vapor deposition to provide silane based HDP oxide (or alternatively, HARP). According to one embodiment the second process for the formation of a capping layer can include PECVD for the formation of TEOS. Embodiments herein recognize that while use of HDP oxide can advantageously provide void reduction and improved optical performance, strain properties of HDP oxide can negatively impact stability of photonics structure 200 wherein its distribution throughout dielectric stack 206 exceeds a threshold. Embodiments herein recognize that layer 201 (surrounded by layer 2601) can include more closely spaced patterned photonics features than layer 4002 (surrounded by layer 2632). According to one embodiment, layer 2601 surrounding layer 201 formed of silicon can be formed using silane based high density plasma chemical vapor deposition to provide silane based HDP oxide to achieve improved void reduction, and layer 2632 surrounding layer 4002 can be formed using PECVD to provide TEOS for improved strain property performance.

The depositing planarizing and polishing of layer 2632 and the depositing planarizing and polishing of layer 2633 can provide elevation control. Elevation control can provide optical coupling between waveguide 218 and a photonics device at an elevation higher that waveguide 218 where optical coupling is targeted. Elevation control can provide optical isolation between waveguide 218 and a photonics device at an elevation higher that waveguide 218 where optical isolation is targeted.

Photonics devices of photonics structure 200 can transmit or receive light signals transmitted through elevation 1632 within light signal transmission region L with material of layer 502 removed within light signal transmission region L. Light signal coupling can be between any two waveguides within light signal transmission region L. A waveguide of the any two waveguides can include a waveguide 218 of FIGS. 4J-4N if fabricated. Light signal coupling can alternatively or in addition be between a light input device 702B and a photonics device defined by grating 220 in light signal transmission region L2.

FIG. 4O illustrates photonics structure 200 as shown in FIG. 4N in an intermediary stage of fabrication after deposition of the photolithography stack comprising layers 751, 752, and 753 on layer 2632. Layer 751 can be an OPL layer, layer 752 can be a SIARC layer, and layer 753 can be a resist layer. Layer 753 provided by a resist layer can be patterned to define a pattern for etching of a trench as set forth in FIG. 4P.

FIG. 4P illustrates photonics structure 200 as depicted in FIG. 4O in an intermediary stage of fabrication subsequent to etching of trenches illustrating formation of trenches 1714 using the pattern of layer 753 provided by a resist layer as depicted in FIG. 4O. In one embodiment, the etching depicted in FIG. 4P can include reactive ion etching (RIE). In one embodiment, the etching depicted in FIG. 4P can include etching of oxide selective to silicon carbon nitride so that material of layer 2633, layer 2632, and layer 2631 are removed without removal of layer 502 formed of silicon carbon nitride.

FIG. 4Q illustrates photonics structure 200 as depicted in FIG. 4P in an intermediary stage of fabrication subsequent to further etching, e.g. etching via RIE. In the etching depicted in FIG. 4Q, etching of layer 502 can be performed selective to layer 422 so that material of layer 502 formed of silicon carbon nitride is etched without etching of material of metallization layer 422. With the etching depicted in FIGS. 4P and 4Q trench 1714 can be patterned. Trench 1714 in one embodiment can define the pattern of a vias layer over metallization layer 422.

FIG. 4R illustrates photonics structure 200 as depicted in FIG. 4Q in an intermediary stage of fabrication subsequent to depositing of a photolithography stack comprising layer 761, layer 762, and layer 763. Layer 761 can include organic photolithography material and can fill trenches 1714 so that trenches 1714 (FIG. 4Q) are filled with organic photolithography material. The photolithography stack depicted in FIG. 4A can include layer 762 formed on layer 761 and layer 763 formed on layer 762. Layer 762 can be formed of SIARC and layer 763 can be formed of resist. Layer 763 in FIG. 4R formed of resist can define a patterning for widening trench 1714 (FIG. 4Q).

FIG. 4S illustrates photonics structure 200 as depicted in FIG. 4R in an intermediary stage of fabrication after etching of trenches 1714 as depicted in FIG. 4R to widen trenches 1714. The etching depicted in FIG. 4S can include RIE in accordance with the pattern defined in layer 763 of FIG. 4R provided by resist. The widened portions of trenches 1714 depicted in FIG. 4S define a pattern for a subsequent metallization layer 422' above metallization layer 422 depicted in the intermediary stage view of FIG. 4S.

FIG. 4T illustrates photonics structure 200 as depicted in FIG. 4S in an intermediary stage of fabrication subsequent to depositing of conductive material 2714 into trenches 1714 as depicted in FIG. 4S. The depositing of conductive material 2714 as depicted in FIG. 4T can include a single conductive material deposition process so that the lower, narrower portions of trenches 1714 and the upper, widened areas of trenches 1714 are commonly filled with a common conductive material deposition process. The fabrication stage views depicted in FIGS. 4P and 4S illustrate a dual damascene process in one embodiment. The use of a single conductive material deposition process so that the lower, narrower portions of trenches 1714 and the upper, widened areas of trenches 1714 are commonly filled with a common conductive material deposition process avoids processing stages and eliminates a resistance increasing metal to metal resistance. Referring again to FIG. 4S, a liner 2713 can be deposited in trenches 2714 prior to depositing of conductive material 2714. Liner 2713 can be formed e.g. of titanium (Ti), titanium nitride (TiN), or tantalum nitride (TaN).

Deposition of conductive material 2714 can include use of physical vapor deposition (PVD). With use of PVD a material being deposited transitions from a condensed phase to a vapor phase and then back to a thin film condensed phase. A PVD process can include sputtering and evaporation. Deposition of conductive material 2714 can be performed so that conductive material 2714 covers an entire top surface of a wafer supporting photonics structure 200 in the intermediary stage of fabrication as shown in FIG. 4T. Photonics structure 200 can be fabricated using a silicon insulator (SOI) wafer having a substrate 100, layer 202 provided by an insulator layer, and layer 201 formed of silicon as set forth herein further in reference to FIG. 2A.

FIG. 4U illustrates photonics structure 200 as shown in FIG. 4T in an intermediary stage of fabrication after planarization of photonics structure 200. Planarization depicted in the intermediary fabrication stage view of FIG. 4U can include CMP planarization to reduce an elevation of photonics structure 200 to elevation 1642 as depicted in FIG. 4U. Planarization as depicted in FIG. 4U can be performed so that a top surface of photonics structure 200 as depicted in the intermediary stage view of FIG. 4U is partially defined by conductive material 2714 and partially defined by layer 2633. CMP planarization can be accompanied by CMP polishing so that a top surface of photonics structure 200 in the intermediary stage view depicted in FIG. 4U, partially defined by conductive material 2714 and partially defined by layer 2633 is atomically smooth.

FIG. 4V illustrates photonics structure 200 as depicted in FIG. 4U in an intermediary stage of fabrication subsequent to depositing and further processing of layer 2641. Layer 2641 can be formed of dielectric material, e.g. oxide such as $SiO_2$ as shown in FIG. 4V. Layer 2641 can be planarized and polished subsequent to being deposited. Layer 2641 can be deposited using PECVD at a reduced temperature range, e.g. at a temperature between 300° C. and 500° C. Layer 2641 can be planarized using CMP planarization and polished using CMP polishing. Completing of polishing a top surface of layer 2641 can extend in a horizontal plane running in parallel to the X-Y plane of the reference coordinate axis shown. By planarizing of layer 2641 a top surface of layer 2641 can extend in a horizontal plane running parallel with the X-Y plane of the reference coordinate system shown.

FIG. 4W illustrates photonics structure as shown in FIG. 4V in an intermediary stage of fabrication subsequent to further processing to deposit layer 4006 to pattern, planarize via CMP planarization, and polish layer 4006 via CMP polishing, to deposit layer 2642, and to planarize and polish layer 2642 using CMP planarization and polishing. Depositing of layer 4006 and 2642 can be performed using PECVD at a reduced thermal budget, e.g. at a processing temperature of between about 300° C. and about 500° C. Layer 4006 can be provided, e.g. by a single crystalline silicon, polycrystalline silicon, amorphous silicon, silicon nitride, or silicon oxynitride. Patterning of layer 4006 can include use of a photolithography stack as depicted in accordance with the photolithography stack comprising layers 741, 742, and 743 as shown in FIG. 4I for use in patterning waveguide 218 as depicted in FIG. 4J. The photolithography stack configured in accordance with FIG. 4I can be used to pattern waveguide 218 depicted in FIG. 4W, wherein waveguide 218 formed on layer 2641 is at an elevation above a top elevation of metallization layer 422' which can be a termination metallization layer. It can be seen that the processing described for formation of metallization layer 422' can facilitate fabrication of waveguide 218 formed on layer 2641 above an elevation of metallization layer 422' which can be a termination metallization layer. On completion of patterning of layer 4006 to define waveguide 218 formed on layer 2641, waveguide 218 formed on layer 2641 can be subject to further processing such as line edge roughness processing of vertical sidewall of waveguide 218 formed on layer 2641 in the manner described in connection with waveguide 218 of FIG. 4J.

Regarding layer 2642, layer 2642 can be formed of dielectric material, e.g. oxide such as $SiO_2$. Planarization of layer 4006 and layer 2642 can include use of CMP planarization so that a top surface of layer 4006 and layer 2642 on completion of planarizing extends in a horizontal plane running parallel to the X-Y plane of the reference coordinate system shown. CMP planarization can be accompanied by CMP polishing so that a top surface of layer 4006 and layer 2642 respectively are atomically smooth.

Figure 4X:
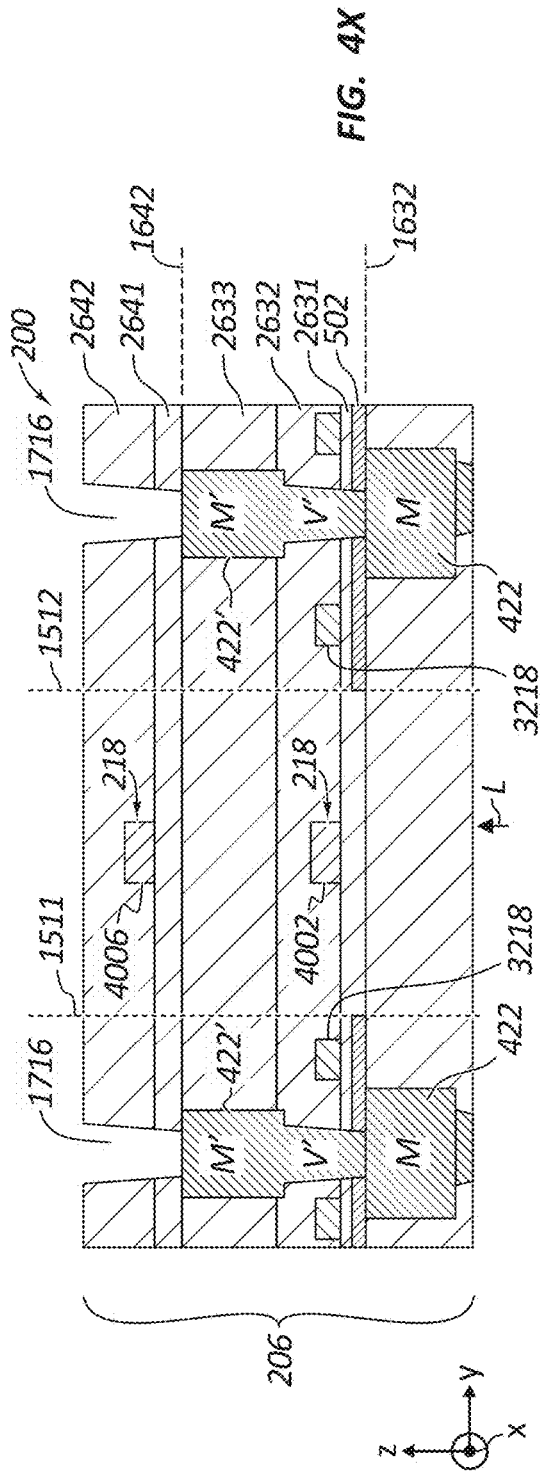

FIGS. 4X and 4Y illustrate processing stages wherein metallization layer 422' is a termination metallization layer of photonics structure 200. For example, referring to FIG. 2A metallization layer 422E as shown can be regarded as a termination metallization layer. Fabricating as described in connection with FIGS. 4X and 4Y can configure photonics structure 200 for connection with external fabricated structures optical electrical with external electrical or optoelectrical structures such as e.g. printed circuit boards, interposers, ball grid arrays, and the like.

FIG. 4X illustrates photonics structure 200 as shown in FIG. 4W in an intermediary stage of fabrication subsequent to further patterning to define trenches 1716 formed in layers 2641 and 2642 to reveal a top surface of metallization layer 422'. Trenches 1716 can be formed using a trench formation process as described in connection with FIGS. 4O and 4P for use in the formation of trenches 1714 depicted in FIG. 4P.

FIG. 4Y illustrates photonics structure 200 as depicted in FIG. 4X in an intermediary stage of fabrication subsequent to formation of under bump metallization formation 2718 (UBM) in trench 1716. Under bump metallization formation 2718 (UBM) facilitates connection thereto of a solder bump (not shown) for connection to an external fabricated structure such as a printed circuit board interposer or ball grid array. In one example, left side trench 1716 shown in FIG. 4Y can be fabricated to be absent of an under bump metallization formation 2718 (UBM), e.g. for accommodation of a wire bond thereto.

Photonics structure 200 can be subject to further fabrication processing for defining terminations 6002, as shown in FIGS. 2A and 4Y. Photonics structure 200 can include one or more termination 6002 formed on a termination metallization layer, such as described in reference to metallization layer 422E of FIG. 2A or metallization layer 422' of FIG. 4W-4Z. Termination 6002 can include, e.g., one or more of (a) an opening formed in photonics dielectric stack 206 opening to the metallization layer, (b) a pad formed on the metallization layer and an opening to the pad; (c) an under bump metallization (UBM) formation formed on the metallization layer with an opening formed in photonics dielectric stack 206 to the UBM formation; (d) a UBM formation formed on the metallization layer and a solder bump formed on the UBM externally protruding from photonics dielectric stack 206. Embodiments herein recognize that providing a termination metallization layer 422' to be formed of aluminum can provide various advantages. For example, because aluminum is not susceptible to corrosion by oxidization, terminations such as termination 6002 can be fabricated to feature reduced contact resistance.

FIG. 4Z illustrates photonics structure 200 in an alternative embodiment, wherein layer 502 providing a barrier layer and formed of barrier material is replaced and substituted with layer 602 providing a barrier layer and formed of silicon nitride, SiN, which can provide barrier functionality as described hereto in connection with silicon carbon nitride SiCN, e.g. can inhibit migration of copper from metallization layer 422 and can inhibit oxidization of metallization layer 422. For fabrication of the structure depicted in FIG. 4Z, fabrication can proceed according to the fabrication stages depicted in reference to FIGS. 4A-4G as set forth herein, except that layer 602 can be substituted for layer 502. Further, as shown in FIG. 4Z patterning of layer 602 can be modified so that in light signal transmission region L waveguide 214 can be patterned as shown in FIG. 4Z. Layer 602 can be patterned to define waveguide 214 by modification of the photolithography stack comprising layers 731, 732, and 733 depicted in FIG. 4C. The modification can include modification so that layer 733 formed of resist material includes a pattern to define waveguide 214 as depicted in FIG. 4Z. Waveguide 214 on patterning thereof can be subject to line edge roughness processing of vertical sidewall thereof in accordance with line edge roughness processing set forth herein. In FIG. 4Z, elevation 1634 can depict any one of elevations 1634A or 1634B as shown in FIG. 2A.

In one alternative embodiment, with reference with FIG. 4Y, layer 2641 can be provided by barrier layer formed of silicon nitride (SiN). In such an embodiment, the described silicon nitride layer provided by layer 2641 can be subject to patterning to define waveguide 218' shown in dashed form in FIG. 4Y with sections of layer 2641 adjacent to waveguide 218' removed. Waveguide 218' on patterning thereof can be subject to line edge roughness processing of vertical sidewall thereof in accordance with line edge roughness processing set forth herein. With reference to the embodiment described in connection with waveguide 218' of FIG. 4Y, waveguide 218 defined by patterning of layer 4006 can deleted by the avoiding of depositing and patterning of layer 4006.

Referring to FIG. 4Y it is seen that waveguide 218 defined by patterning of layer 4006 (or waveguide 218' defined by patterning layer 2641) can be formed to have an elevation above a top elevation of termination metallization layer 422'. Fabricating waveguide 418 or waveguide 418' as described to have an elevation above a top elevation of metallization layer 422' provides various advantages. For example, the described configuration can facilitate coupling of a light signal between waveguide 218 defined by layer 4006 (or waveguide 218' defined by layer 2641) and an external photonics device external to photonics structure 200 e.g. which can be attached to a topside of photonics structure 200.

Atomically smooth surfaces set forth herein in various embodiments can refer to surfaces having smoothness ratings of about <5A RMS in one embodiment. Atomically smooth surfaces set forth herein in various embodiments can refer to surfaces having smoothness ratings of about <4A RMS in one embodiment. Atomically smooth surfaces set forth herein in various embodiments can refer to surfaces having smoothness ratings of about <3A RMS in one embodiment. Atomically smooth surfaces set forth herein in various embodiments can refer to surfaces having smoothness ratings of about <2A RMS in one embodiment.

Photonics structure 200 can be configured so that any depicted first and second waveguides can be configured for optically coupling of a light signal therebetween. Photonics structure 200 can be configured so that any depicted first and second waveguides can be configured for optical isolation therebetween.

The terminology used herein is for the purpose of describing particular embodiments only and is not intended to be limiting. The term "on" in one embodiment can refer to a relationship where an element is "directly on" a specified element without intervening elements between the element and the specified element. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A photonics device, comprising:
   a photonics dielectric stack on a substrate, the photonics dielectric stack including a dielectric layer and one or more photonics devices having a photosensitive material formation;
   a first dielectric material layer with a first portion thereof formed over the photosensitive material formation, and a second portion thereof formed over the dielectric layer of the dielectric stack;
   an etch stop layer over the first layer of dielectric material; and
   a second dielectric material layer over the etch stop layer, the second dielectric material layer including an etched trench over the photosensitive material formation wherein a bottom of the trench is delimited by the photosensitive material formation.

2. A method for fabricating the photonics device of claim 1, comprising:
   depositing a layer of dielectric material so that a first portion of the layer of dielectric material is formed on a photosensitive material formation and so that a second portion of the layer of dielectric material is formed on a dielectric layer of a dielectric stack of a photonics structure having one or more photonics device;
   depositing an etch stop layer on the layer of dielectric material;
   forming a dielectric material layer on the etch stop layer;
   performing first etching of the dielectric material layer selective to the etch stop layer to define a trench over the photosensitive material formation;
   performing second etching of the etch stop layer, wherein the second etching removes material of the etch stop layer through a thickness of the etch stop layer and material of the layer of dielectric material through a portion of a thickness of the layer of dielectric material, the second etching increasing a depth of the trench; and
   performing plasmaless etching of a remaining thickness of the layer of dielectric material to reveal the photosensitive material formation so that a bottom of the trench is delimited by the photosensitive material formation.

3. The device of claim 1, wherein the etched trench is formed by plasmaless etching.

4. The device of claim 1, wherein the photosensitive material formation is germanium.

5. The device of claim 1, wherein the etch stop layer is patterned such that no light signal propagating within the photonics device is coupled to the etch stop layer.

6. The device of claim 1, further including an aluminum deposit within the trench having a planarized top surface thereof such that that top surface is defined by, at least, the dielectric stack and the aluminum deposit.

7. A photonics device, comprising:
a photonics dielectric stack on a substrate and including a dielectric layer, the photonics dielectric stack including one or more photonics devices having a photosensitive material formation;
a first dielectric material layer with a first portion thereof formed over the photosensitive material formation, and a second portion thereof formed over the dielectric layer of the dielectric stack;
an etch stop layer over the first layer of dielectric material;
a second dielectric material layer on the etch stop layer, the second dielectric material layer including an etched trench over the photosensitive material formation such that a bottom of the trench is delimited by the photosensitive material formation, the trench further including an upper region of wider diameter and a lower region of narrower diameter, the trench further including an aluminum deposit including a top surface thereof that is atomically smooth and planar, the top surface defined by a dielectric layer of the photonics dielectric stack and the aluminum.

8. The device of claim 7, wherein the photonics device further having a bottom elevation thereof that is higher than an elevation of the planar top surface of the aluminum deposit.

9. The device of claim 8, further including:
one or more dielectric layers over the planar top surface;
a layer of waveguiding material over the one or more dielectric layers such that the layer of waveguiding material defines the photonics device.

10. The device of claim 7, further including a barrier layer comprised of a copper metallization layer, and wherein the trench is formed from etching through the barrier layer.

11. The device of claim 1, further including an aluminum deposit within the trench having a planarized top surface thereof such that that top surface is defined by, at least, the dielectric stack and the aluminum deposit, and a metallization layer formation over the aluminum deposit and in electrical communication therewith.

12. The device of claim 1, an aluminum deposit within the trench having a planarized top surface thereof such that that top surface is defined by, at least, the dielectric stack and the aluminum deposit, and a metallization layer formation over the aluminum deposit and in electrical communication therewith and further including a termination metallization layer formation at an elevation higher than an elevation of the metallization layer formation, the termination metallization layer formation in electrical communication with the metallization layer.

13. A method for fabricating the photonics device of claim 1, wherein the method includes forming the etched trench by plasmaless etching.

14. The device of claim 1, wherein an entirety of the first dielectric layer is formed above a top elevation of the photosensitive material formation.

15. The device of claim 1, wherein the etch stop layer includes a truncated length truncated so that left and right ends of the etch stop layer is are substantially aligned over above, respectively, a left and right section of the trench in which the photosensitive material formation is formed.

16. The device of claim 1, wherein the first dielectric layer extends horizontally at a common elevation throughout its length.

17. The photonics device of claim 1, wherein the bottom of the trench is delimited by semiconductor material of the photosensitive material formation.

18. The photonics device of claim 7, wherein the bottom of the trench is delimited by semiconductor material of the photosensitive material formation.

19. The photonics device of claim 7, wherein the bottom of the trench is delimited by semiconductor material of the photosensitive material formation, wherein the semiconductor material delimiting the bottom of the trench includes semiconductor material of an ion implantation region of the photosensitive material formation.

20. A method for fabricating photonics device comprising:
depositing a layer of dielectric material so that a first portion of the layer of dielectric material is formed on a photosensitive material formation and so that a second portion of the layer of dielectric material is formed on a dielectric layer of a dielectric stack of a photonics structure having one or more photonics device;
depositing an etch stop layer on the layer of dielectric material;
forming a dielectric material layer on the etch stop layer;
performing first etching of the dielectric material layer selective to the etch stop layer to define a trench over the photosensitive material formation;
performing second etching of the etch stop layer, wherein the second etching removes material of the etch stop layer through a thickness of the etch stop layer and material of the layer of dielectric material through a portion of a thickness of the layer of dielectric material, the second etching increasing a depth of the trench; and
performing plasmaless etching of a remaining thickness of the layer of dielectric material to reveal the photosensitive material formation so that a bottom of the trench is delimited by the photosensitive material formation.

* * * * *